(12) United States Patent
Izuha et al.

(10) Patent No.: US 7,784,020 B2
(45) Date of Patent: Aug. 24, 2010

(54) SEMICONDUCTOR CIRCUIT PATTERN DESIGN METHOD FOR MANUFACTURING SEMICONDUCTOR DEVICE OR LIQUID CRYSTAL DISPLAY DEVICE

(75) Inventors: Kyoko Izuha, Yokohama (JP); Fumihiro Minami, Yokohama (JP); Toshiaki Ueda, Yokohama (JP); Ryuji Ogawa, Yokohama (JP); Satoshi Tanaka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 623 days.

(21) Appl. No.: 11/429,077

(22) Filed: May 8, 2006

(65) Prior Publication Data

US 2006/0271907 A1    Nov. 30, 2006

(30) Foreign Application Priority Data

May 10, 2005    (JP)    ............................. 2005-137423

(51) Int. Cl.
*G06F 17/50*    (2006.01)
(52) U.S. Cl. .......................................... 716/21; 716/19
(58) Field of Classification Search ............. 716/19–21; 430/5, 22
See application file for complete search history.

(56) References Cited

U.S. PATENT DOCUMENTS

| | | | |
|---|---|---|---|
| 6,174,630 B1 * | 1/2001 | Petranovic et al. ............. | 430/5 |
| 6,370,441 B1 * | 4/2002 | Ohnuma ..................... | 700/121 |
| 6,425,117 B1 * | 7/2002 | Pasch et al. .................... | 716/21 |
| 6,532,585 B1 * | 3/2003 | Petranovic et al. ............. | 716/19 |
| 6,928,635 B2 | 8/2005 | Pramanik et al. | |
| 2003/0106037 A1 * | 6/2003 | Moniwa et al. ................ | 716/19 |
| 2004/0237061 A1 | 11/2004 | Kahng et al. | |

FOREIGN PATENT DOCUMENTS

| | | |
|---|---|---|
| JP | 9-319067 | 12/1997 |
| JP | 2004-279997 | 10/2004 |

OTHER PUBLICATIONS

Newmark, D. M. et al., "Large Area Optical Proximity Correction Using Pattern Based Corrections," SPIE, vol. 2322, pp. 374-386, (1994).

* cited by examiner

*Primary Examiner*—Jack Chiang
*Assistant Examiner*—Binh C Tat
(74) *Attorney, Agent, or Firm*—Finnegan, Henderson, Farabow, Garrett & Dunner, L.L.P.

(57) ABSTRACT

A semiconductor circuit pattern design method includes the following operations. A design pattern is created by placing a plurality of cells in each functional block as a unit of the semiconductor circuit and executing routing among the plurality of placed cells. Mask pattern data based on the design pattern is created. A predictive pattern to be formed on the substrate by the mask pattern data is predicted. A difference amount between the predictive pattern and a target pattern to be formed on the substrate by the mask pattern data is checked. The difference amount is compared with a predetermined allowable variation amount. If the difference amount is larger than the allowable variation amount in the comparison, at least one of placement and routing of the cells in the design pattern corresponding to the mask pattern data used to predict the predictive pattern is corrected.

6 Claims, 25 Drawing Sheets

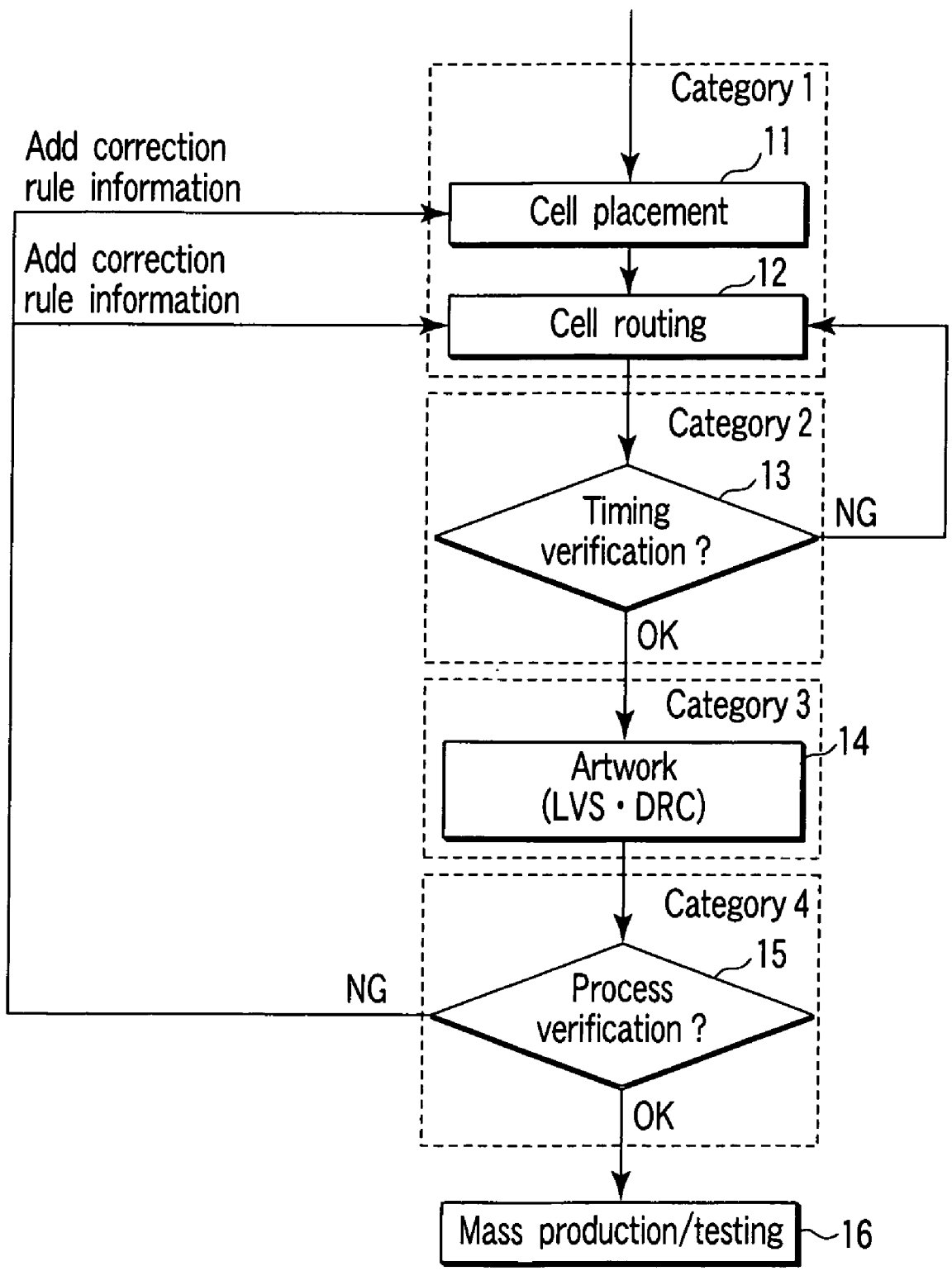
F I G. 1

| Line [nm] | Space [nm] |
|---|---|
| 90 | 90≦S≦110 |
| 100 | 90≦S≦130 |
| 110 | 90≦S≦190 |
| 120 | 90≦S≦250 |
| 150 | 100≦S≦300 |
| 200 | 120≦S≦500 |
| 300 | 130≦S≦500 |
| 500 | 150≦S≦500 |

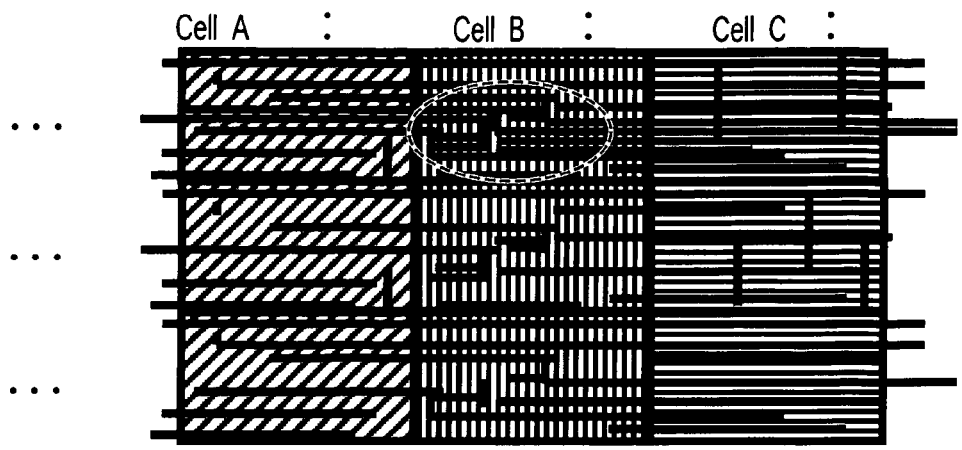
F I G. 13A
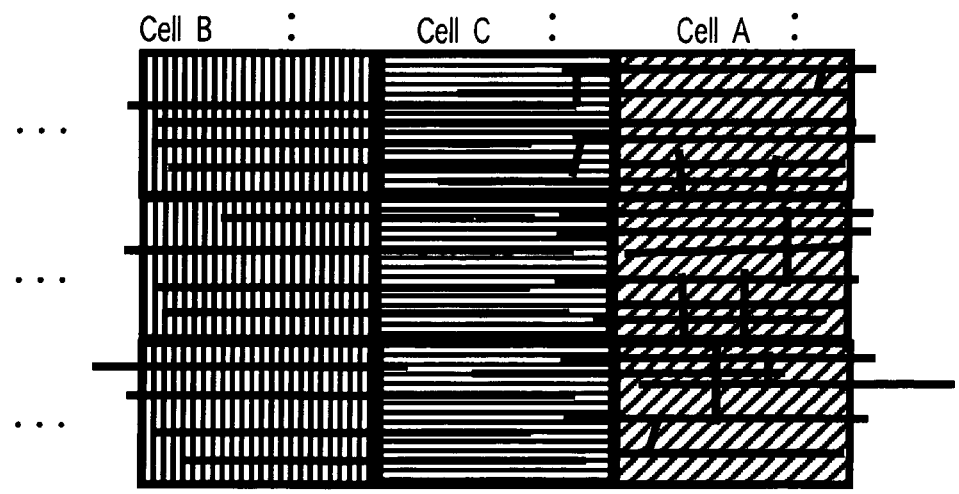
F I G. 13B
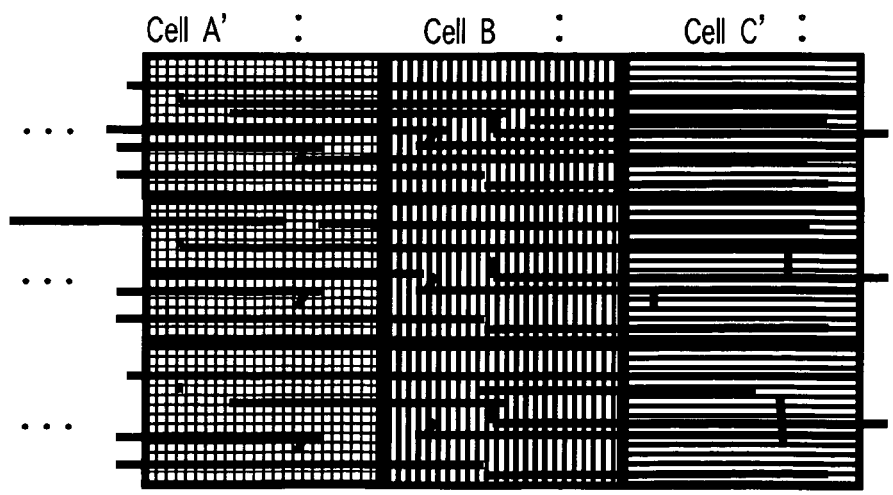
F I G. 13C

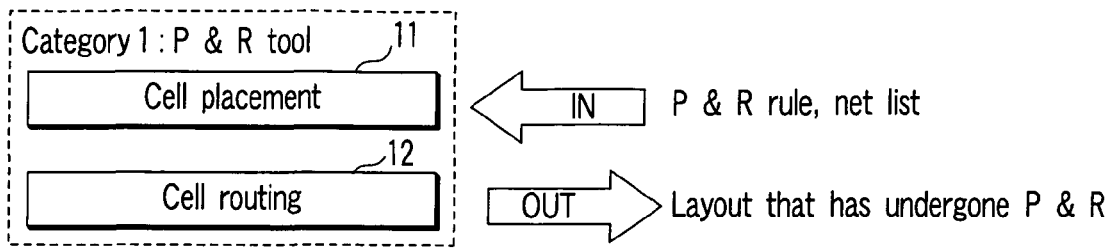
F I G. 15A
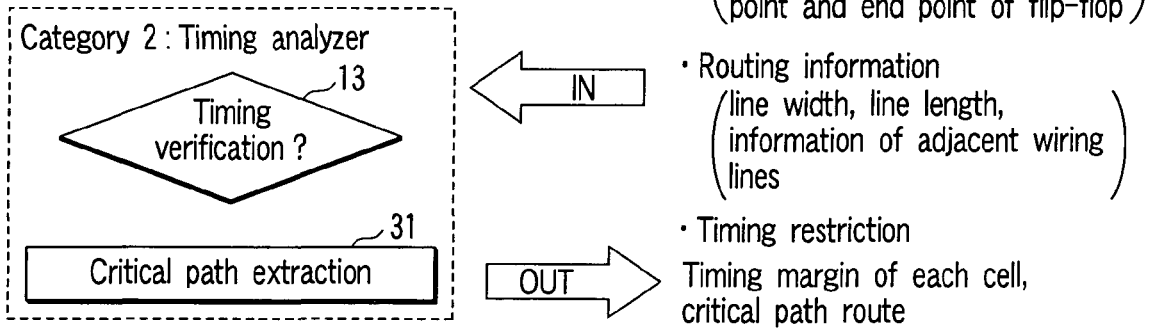
F I G. 15B
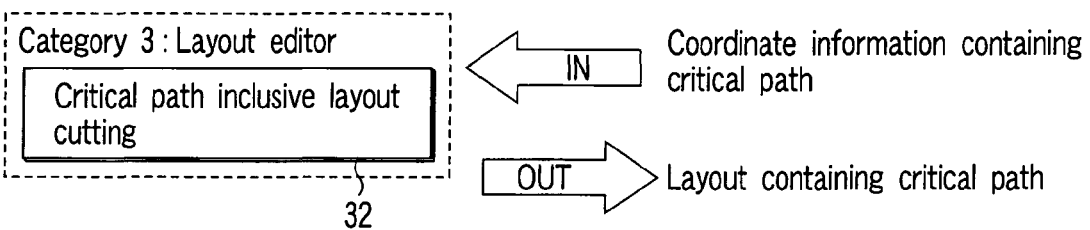
F I G. 15C
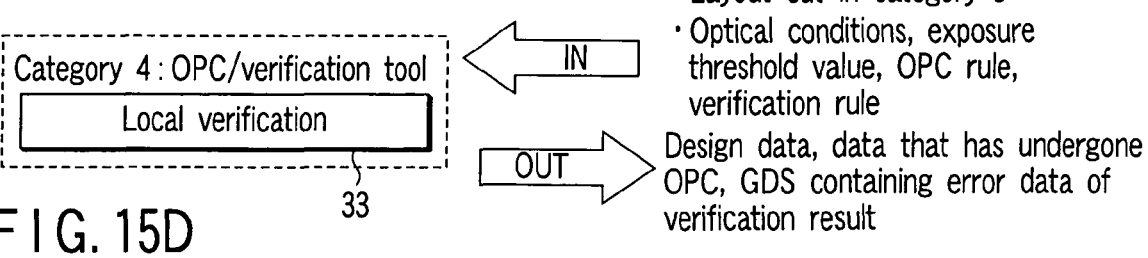
F I G. 15D

| Path | MAX | typical | MIN |
|---|---|---|---|
| | Dimension (1) | Dimension (2) | Dimension (3) |
| | Cell A (Delay A, Power consumption A)<br>Cell B (Delay B, Power consumption B)<br>...<br>Cell N (Delay N, Power consumption N) | Cell A (Delay A, Power consumption A)<br>Cell B (Delay B, Power consumption B)<br>...<br>Cell N (Delay N, Power consumption N) | Cell A (Delay A, Power consumption A)<br>Cell B (Delay B, Power consumption B)<br>...<br>Cell N (Delay N, Power consumption N) |
| | Delay center value, Standard deviation σ | Delay center value, Standard deviation σ | Delay center value, Standard deviation σ |
| Routing | MAX | typical | MIN |
| | Dimension (4) | Dimension (5) | Dimension (6) |
| | Cell A (Wiring width A, Space A)<br>Cell B (Wiring width B, Space B)<br>...<br>Cell N (Wiring width N, Space N) | Cell A (Wiring width A, Space A)<br>Cell B (Wiring width B, Space B)<br>...<br>Cell N (Wiring width N, Space N) | Cell A (Wiring width A, Space A)<br>Cell B (Wiring width B, Space B)<br>...<br>Cell N (Wiring width N, Space N) |
| | Delay center value, Standard deviation σ | Delay center value, Standard deviation σ | Delay center value, Standard deviation σ |

F I G. 21

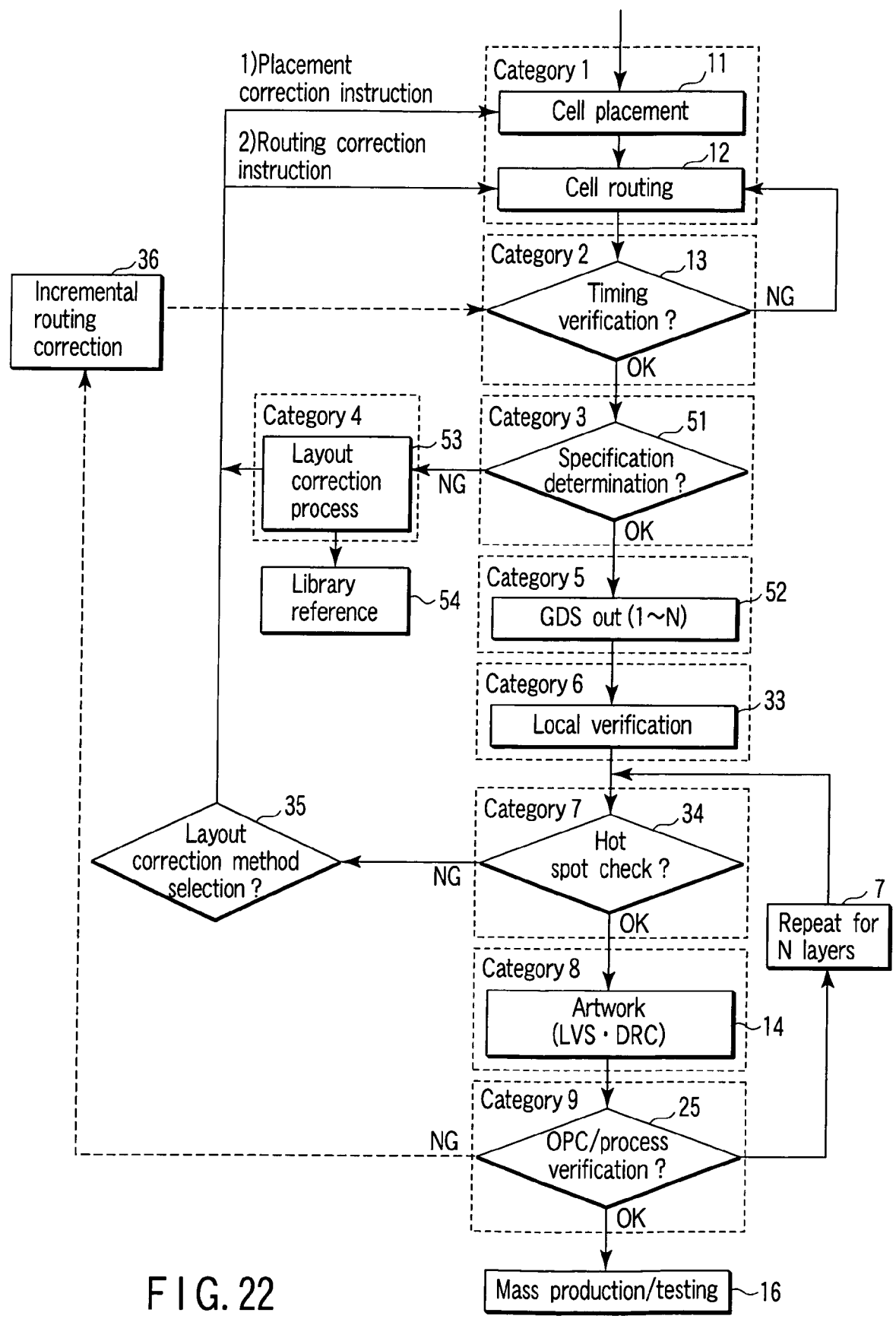
F I G. 22

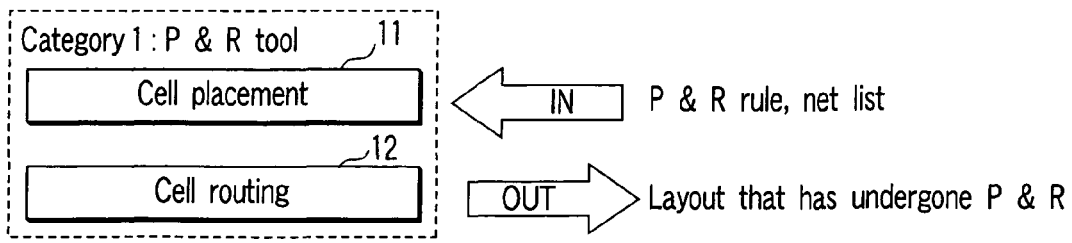
F I G. 23A
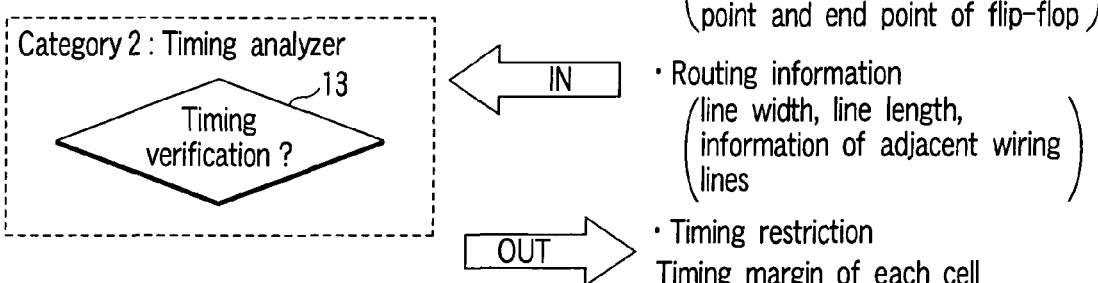
F I G. 23B
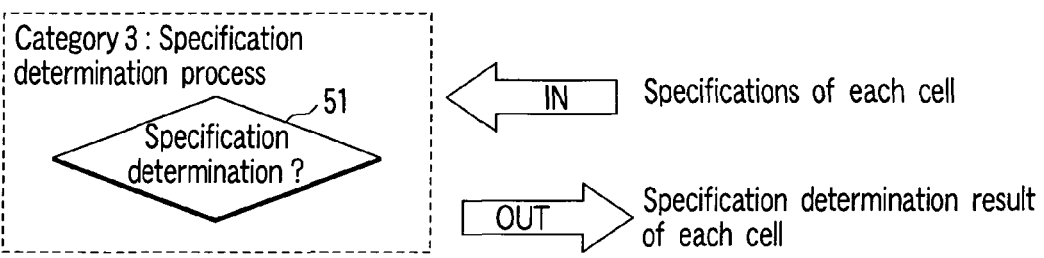
F I G. 23C
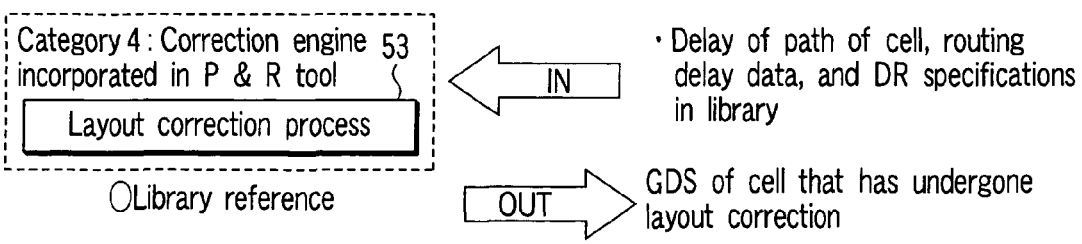
F I G. 23D
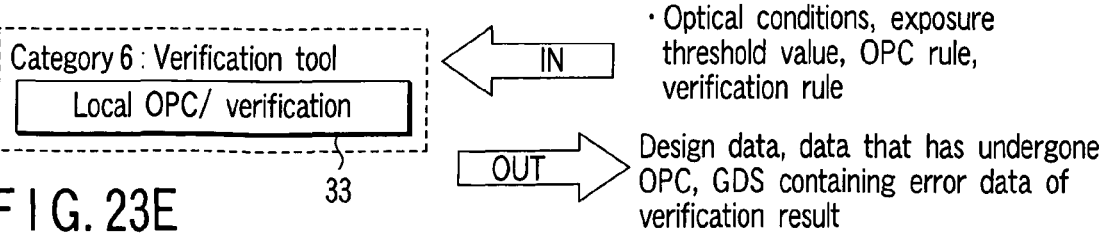
F I G. 23E

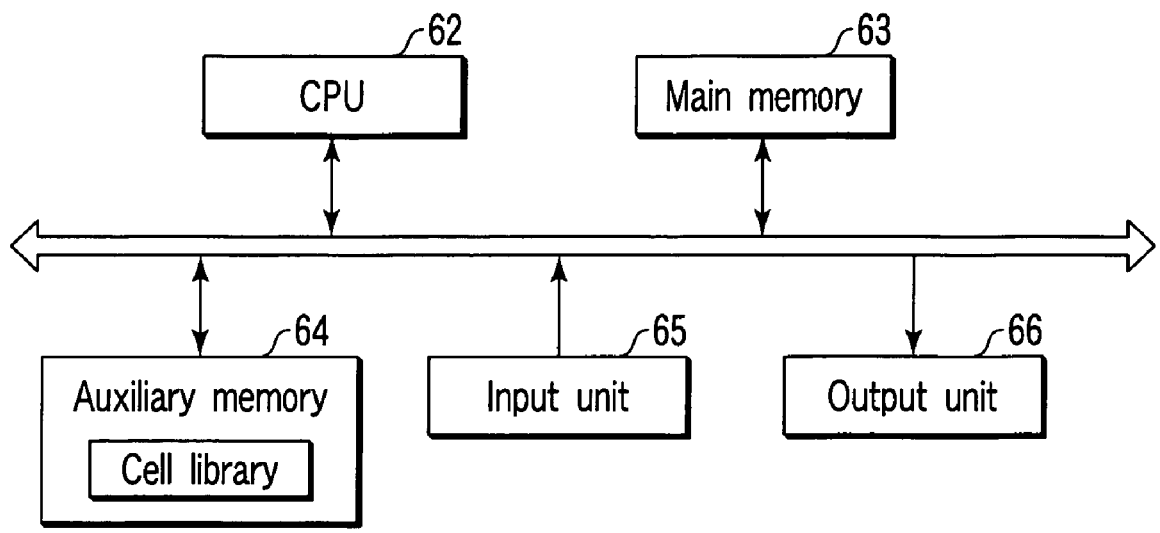
F I G. 25
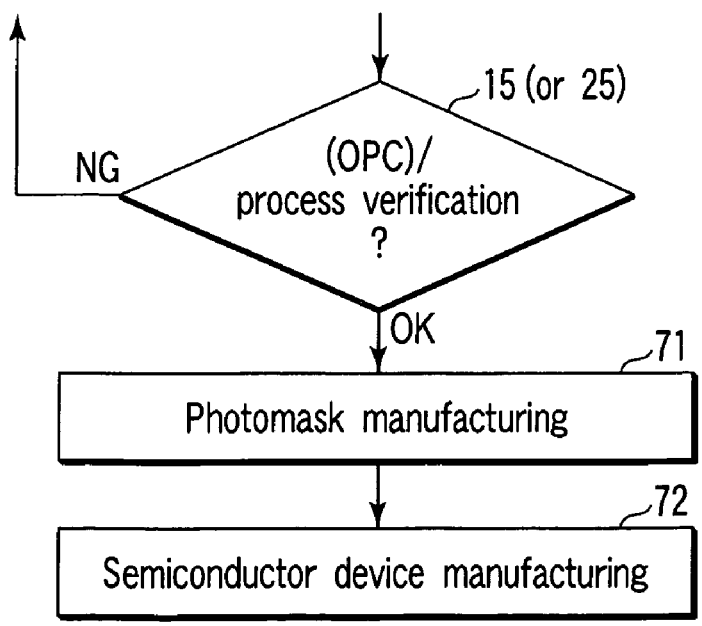
F I G. 26

SEMICONDUCTOR CIRCUIT PATTERN DESIGN METHOD FOR MANUFACTURING SEMICONDUCTOR DEVICE OR LIQUID CRYSTAL DISPLAY DEVICE

CROSS-REFERENCE TO RELATED APPLICATIONS

This application is based upon and claims the benefit of priority from prior Japanese Patent Application No. 2005-137423, filed May 10, 2005, the entire contents of which are incorporated herein by reference.

BACKGROUND OF THE INVENTION

1. Field of the Invention

The present invention relates to a semiconductor circuit pattern design method for manufacturing a semiconductor device or liquid crystal display device, a computer program product for pattern design, and a method of manufacturing a semiconductor device or liquid crystal display device.

2. Description of the Related Art

Along with the recent remarkable progress of semiconductor manufacturing technologies, semiconductor elements with a minimum line width of 0.1 µm or less have been mass-produced. This microfabrication is implemented by dramatic improvements of micropattern formation technologies and various EDA tools for circuit pattern generation.

In an era of sufficiently large pattern sizes, the planar shape of an LSI pattern to be formed on a wafer was directly formed as a design pattern, and a mask pattern faithfully complying with the design pattern was created. The mask pattern was transferred onto a wafer by using a projecting optical system, and the underlying layers were etched. In this way, a pattern that was almost the same as the design pattern could be formed on the wafer. However, as the pattern size decreases, it is becoming difficult to faithfully form a pattern in each process, and the final finished dimensions differ from the dimensions of the design pattern.

Especially in lithography and etching processes which are most important for achieving microfabrication, the layout environment of other patterns placed around a pattern to be formed greatly influences the dimensional accuracy of the pattern. As techniques of reducing the influence, optical proximity correction (OPC) and process proximity correction (PPC) have been reported, which add an assist pattern to the design pattern in advance such that the desired pattern is reflected on the dimensions after working (e.g., Jpn. Pat. Appln. KOKAI Publication No. 9-319067 and D. M. Newmark et al., "Large Area Optical Proximity Correction using Pattern Based Correction", SPIE Vol. 2322 (1994), p. 374).

From the viewpoint of performance, currently, intra-cell and routing layouts are designed such that timing margins are satisfied. Hence, cells with an unreasonable driving force are used to obtain a transistor operation speed within the margin. Serious problems also arise because the chip area increases as a result of buffer insertion, and the load on iteration increases due to timing closure by transistors designed in dimensions of worst conditions.

Presently, since the design pattern created by the designer largely differs from the mask pattern used for exposure because of the complex OPC and PPC technologies, the finished pattern shape on the wafer can hardly be predicted. For this reason, verification using a process simulator must be executed for the design pattern prior to shipping the design pattern, i.e., ending creation of the design pattern. However, lithography verification is done in the final stage of design process. Feeding back the verification result indicates regress in the design step, which places a heavy load on the turnaround time of the design pattern creation step.

As described above, in the conventional pattern design method, it is not easy to predict the finished pattern shape on the wafer because the OPC and PPC technologies are complex. Hence, the load on timing closure on the design side and the load on OPC and process verification on the manufacture side increase.

BRIEF SUMMARY OF THE INVENTION

According to a first aspect of the present invention, there is provided a pattern design method of designing a pattern of a semiconductor circuit to be formed on a substrate, comprising: creating a design pattern by placing a plurality of cells in each functional block as a unit of the semiconductor circuit and executing routing among the plurality of placed cells; creating mask pattern data based on the design pattern; predicting a predictive pattern to be formed on the substrate by the mask pattern data; checking a difference amount between the predictive pattern and a target pattern to be formed on the substrate by the mask pattern data; comparing the difference amount with a predetermined allowable variation amount; and correcting at least one of placement and routing of the cells in the design pattern corresponding to the mask pattern data used to predict the predictive pattern if the difference amount is larger than the allowable variation amount in the comparing.

According to a second aspect of the present invention, there is provided a pattern design method of designing a pattern of a semiconductor circuit to be formed on a substrate, comprising: creating a design pattern by placing a plurality of cells in each functional block as a unit of the semiconductor circuit and executing routing among the plurality of placed cells; analyzing an electrical characteristic of the semiconductor circuit corresponding to the design pattern; cutting a part of the design pattern on the basis of an analysis result of the electrical characteristic; predicting a predictive pattern to be formed on the substrate by the cut part of the design pattern; checking a difference amount between the predictive pattern and a target pattern to be formed on the substrate by the cut part of the design pattern; comparing the difference amount with a predetermined allowable variation amount; outputting error data if the difference amount is larger than the allowable variation amount in the comparing; extracting hot spot information on the basis of the error data; and correcting at least one of placement and routing of the part of the design pattern corresponding to the predictive pattern in accordance with the hot spot information.

According to a third aspect of the present invention, there is provided a pattern design method of designing a pattern of a semiconductor circuit to be formed on a substrate, comprising: creating a design pattern by placing a plurality of cells in each functional block as a unit of the semiconductor circuit and executing routing among the plurality of placed cells; analyzing an electrical characteristic of the plurality of cells corresponding to the design pattern; determining whether an analysis result of the electrical characteristic falls within a predetermined range; executing one of replacement of the cell and correction of the routing if the analysis result of the electrical characteristic of the cells falls outside the predetermined range in the determining; predicting a predictive pattern to be formed on the substrate by a part of the design pattern corresponding to the cells if the analysis result of the electrical characteristic of the cells falls within the predetermined range in the determination; checking a difference amount between the predictive pattern and a target pattern to be formed on the substrate by the part of the design pattern; comparing the difference amount with a predetermined allowable variation amount; outputting error data if the difference amount is larger than the allowable variation amount in the comparing; extracting hot spot information on the basis of the error data; and correcting at least one of placement and routing of the part of the design pattern corresponding to the predictive pattern in accordance with the hot spot information.

According to a fourth aspect of the present invention, there is provided a computer program product for designing a pattern of a semiconductor circuit to be formed on a substrate, comprising: creating a design pattern by placing a plurality of cells in each functional block as a unit of the semiconductor circuit and executing routing among the plurality of placed cells; creating mask pattern data based on the design pattern; predicting a predictive pattern to be formed on the substrate by the mask pattern data; checking a difference amount between the predictive pattern and a target pattern to be formed on the substrate by the mask pattern data; comparing the difference amount with a predetermined allowable variation amount; and correcting at least one of placement and routing of the cells in the design pattern corresponding to the mask pattern data used to predict the predictive pattern if the difference amount is larger than the allowable variation amount in the comparison.

According to a fifth aspect of the present invention, there is provided a method of manufacturing a semiconductor device by forming a pattern of a semiconductor circuit on a substrate by using a photomask, comprising forming the photomask, the photomask being formed by: creating a design pattern by placing a plurality of cells in each functional block as a unit of the semiconductor circuit and executing routing among the plurality of placed cells; creating mask pattern data based on the design pattern; predicting a predictive pattern to be formed on the semiconductor substrate by the mask pattern data; checking a difference amount between the predictive pattern and a target pattern to be formed on the semiconductor substrate by the mask pattern data; comparing the difference amount with a predetermined allowable variation amount; and correcting at least one of placement and routing of the cells in the design pattern corresponding to the mask pattern data used to predict the predictive pattern if the difference amount is larger than the allowable variation amount in the comparing.

BRIEF DESCRIPTION OF THE SEVERAL VIEWS OF THE DRAWING

FIG. 1 is a flowchart showing a pattern data design method according to a first embodiment of the present invention;

FIGS. 12A, 12B, and 13A to 13C are schematic views of routing correction according to the third embodiment;

FIGS. 15A to 15D and 16A to 16C are views showing categories of the flow in FIG. 14 divided in accordance with the tools of processes;

FIG. 21 is a graph showing the contents of a library used in the fifth embodiment;

FIG. 22 is a flowchart showing a pattern data design method according to a sixth embodiment of the present invention;

FIGS. 23A to 23E and 24A to 24C are views showing categories of the flow in FIG. 22 divided in accordance with the tools of processes;

FIG. 25 is a block diagram showing the arrangement of a pattern design apparatus according to a seventh embodiment of the present invention;

FIG. 26 is a flowchart showing a semiconductor device manufacturing method according to an eighth embodiment of the present invention.

DETAILED DESCRIPTION OF THE INVENTION

Details of the present invention will be explained below on the basis of illustrated embodiments.

First Embodiment

FIG. 1 is a flowchart showing a pattern data design method according to the first embodiment of the present invention.

In this embodiment, a cell placement step 11, cell routing step 12, timing verification step 13, artwork step 14, process verification step 15, and mass production/testing step 16 are executed sequentially. After the cell placement step 11 to process verification step 15, the verification result is fed back to the cell placement step 11 and cell routing step 12. In the conventional method, the cell placement step 11 to mass production/testing step 16 are executed continuously, as shown in FIG. 25. The first embodiment is different from the conventional method in this point.

In the conventional method, the continuous process is possible only when the layout has no problem from the viewpoint of both timing and lithography. Normally, since the layout has the above-described problems, the design pattern or mask pattern is repeatedly corrected until the problems are solved.

Figure 2A:
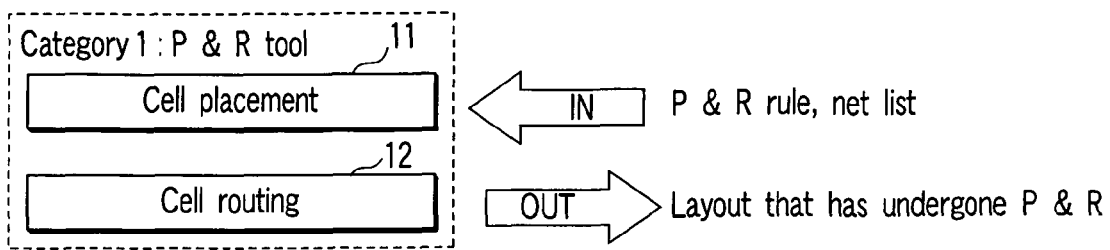
FIGS. 2A to 2D are views showing categories of the flow in FIG. 1 divided in accordance with the tools of processes.

FIGS. 2A to 2D show categories of the flow in FIG. 1 divided in accordance with the tools of processes. In the process of this embodiment, as category 1 (cell placement step 11 and cell routing step 12), a cell placement/routing process is executed by using a place & router tool (P & R tool), as shown in FIG. 2A, as in the normal layout design method. That is, a design pattern is created. The P & R tool used in this category is mentioned next to category 1 in FIG. 2A. A description next to the input arrow (IN) indicates data (P & R rule and net list) to be input to the P & R tool. A description next to the output arrow (OUT) indicates output (layout that has undergone P & R) from the P & R tool.

Figure 2B:
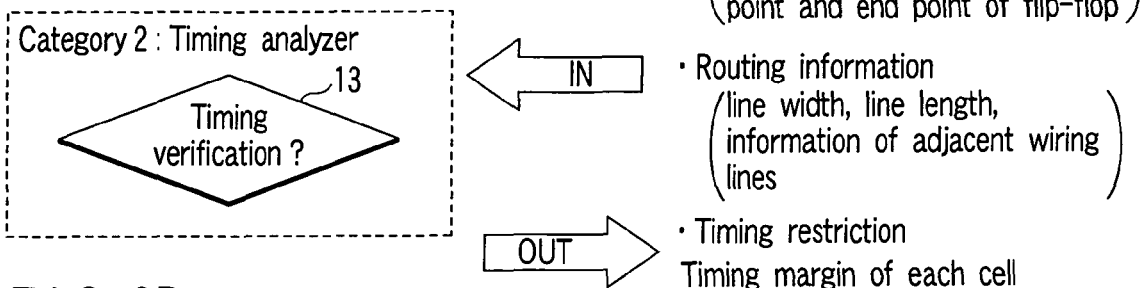
Figure 2C:
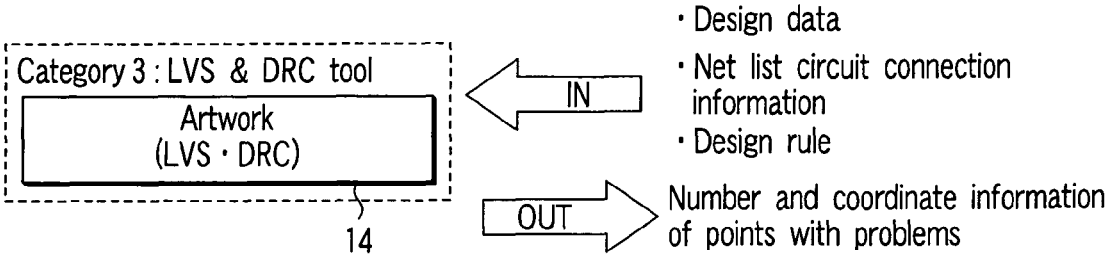
Figure 2D:
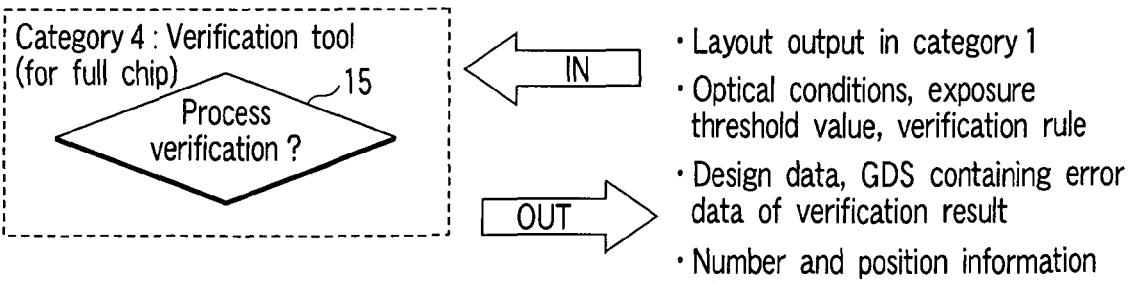

In category 2 (timing verification step 13), as shown in FIG. 2B, timing verification is executed for each cell designed on the basis of a typical design rule (DR), by using a timing analyzer for layout optimization incorporated in the P & R tool. That is, the electrical characteristic of a circuit corresponding to the design pattern is analyzed. Input to the timing analyzer contains net list connection information representing the propagation time along the distance between the start point and the end point of a flip-flop, routing information including a line width, line length, and information of adjacent lines, and timing restriction. On the basis of the input information, the timing analyzer calculates the delay in each path and compares the calculation result with the timing restriction, thereby outputting a timing margin of each path.

If a timing verification non-compliance point is detected in category 2, the layout is corrected by an engineering change order (ECO) process. In this case, most non-compliance points are routing non-compliance points. Hence, correction is done by the ECO process of routing. A layout determined as OK by timing verification is subjected to artwork of category 3 using layout versus schematic and design rule check (LVS and DRC) tools shown in FIG. 2C and then to full-chip process verification of category 4 shown in FIG. 2D.

In the artwork step 14 of category 3, mask pattern data is created by the LVS tool on the basis of the design pattern. In addition, design data, net list circuit connection information, and design rule are input to the DRC tool. The DRC tool outputs the number and coordinate information of points with problems.

In the process verification step 15 of category 4, the layout output from the P & R tool of category 1, the optical conditions in exposure, the reference light intensity of the product (exposure threshold value), and the verification rule are input. Design data, a layout containing the error information of the verification result, and the number and position information of process verification non-compliance points are output. A process of, e.g., reducing the degree of routing congestion is executed for the non-compliance points of the verification result. Since errors that must be eliminated from the viewpoint of timing are already been corrected in category 2, the load on the full-chip verification in the process verification step is not so heavy.

With the above-described series of processes, efficient pattern design can be executed from the viewpoint of both timing and lithography. Main processes of this embodiment corresponding to the process flow will be described below in detail.

In the pattern layout design stage, after the cell placement step 11 to artwork step 14, graphic design system (GDS) data that had undergone artwork was subjected to process verification. Process verification in this case indicates verification of the processes including lithography and etching conversion differences. In the verification, the displacement amount between the design pattern and the pattern to be formed on a wafer was calculated under the above-described optimum conditions of the product and conditions of various exposures and defocus amounts in the range of predetermined specifications of the product.

As the process margin of the product, the focal depth is ±0.15 μm, and the exposure margin is ±10%. The displacement amount between the design pattern and the pattern to be formed on a wafer was calculated by using a known method (e.g., Jpn. Pat. Appln. KOKAI Publication No. 2004-279997). It was found that a dimensional specification allowable for the product within the process margin (alienation between the design pattern and the pattern to be formed on a wafer), e.g., a dimension of 10 nm was not satisfied at a number of points. In other words, it was found that the displacement amount between the design pattern and the pattern to be formed on a wafer exceeded the allowable dimensional specification (e.g., 10 nm) at a number of points.

In addition, for the process verification non-compliance points where the dimensional specification was not satisfied, the displacement amount was calculated under the conditions of various exposures and defocus amounts within the process margin. By monitoring the average value and variation of the displacement amounts, it was determined whether the process verification non-compliance points were correctable by OPC and whether pattern correction was necessary. By using this method, of the process verification non-compliance points of the product, points with large variations in displacement amount, i.e., points without the margin were subjected to pattern correction.

In this embodiment, most points that required pattern correction were routing portions. Hence, the wiring pattern was corrected in an engineering change order (ECO) process after the artwork step. First, the position coordinates of the points with the unsatisfactory dimensional specification were prepared. Next, a graph (FIG. 3) was prepared, which represented combinations of line width and space allowable when considering the process margin.

Figures 3, 4:
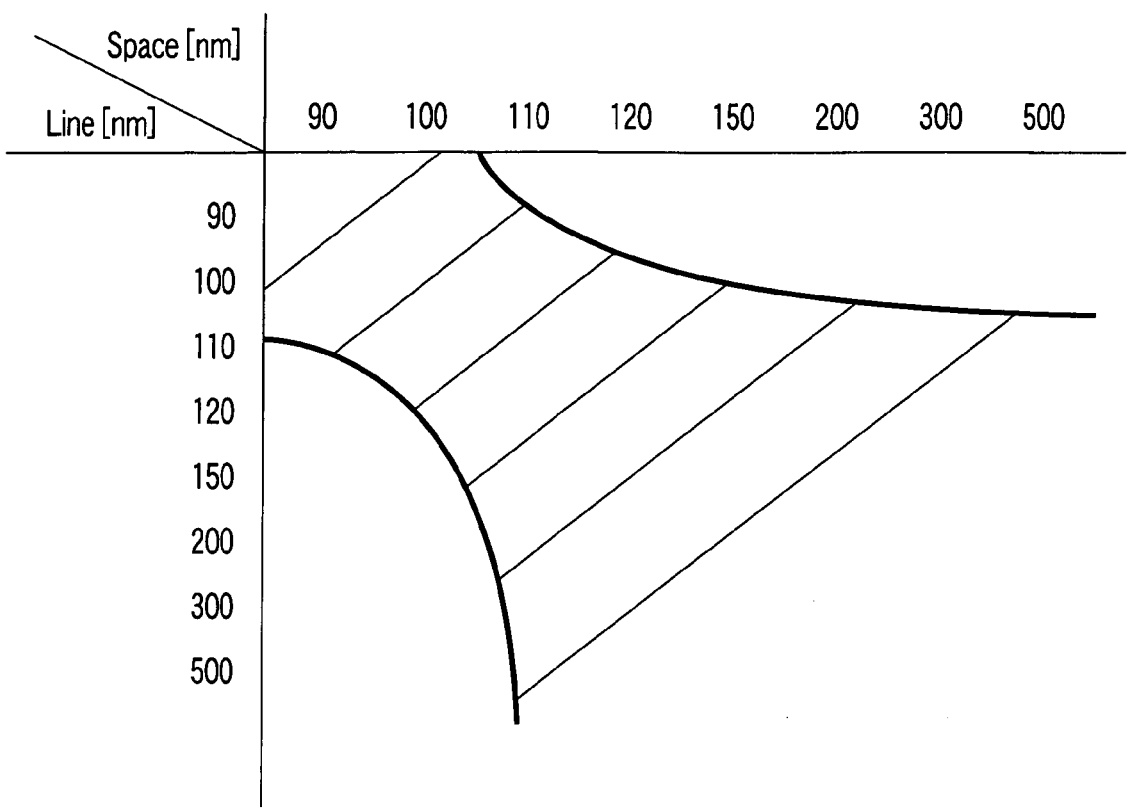
FIG. 3 is a graph of a rule related to a place and router process according to the first embodiment.
FIG. 4 is a diagram of the rule related to the place and router process.

Referring to FIG. 3, the ordinate represents the line width, the abscissa represents the space between wiring lines, and the hatched portion represents an area with allowable process specifications. That is, when layout non-compliance points are corrected in the ECO process after the artwork step complying with the line width and space, no process margin non-compliance points are generated ever after the ECO process. Instead of using the graph shown in FIG. 3, information may be fed back in a form of a P & R design rule shown in FIG. 4.

Figure 5A:
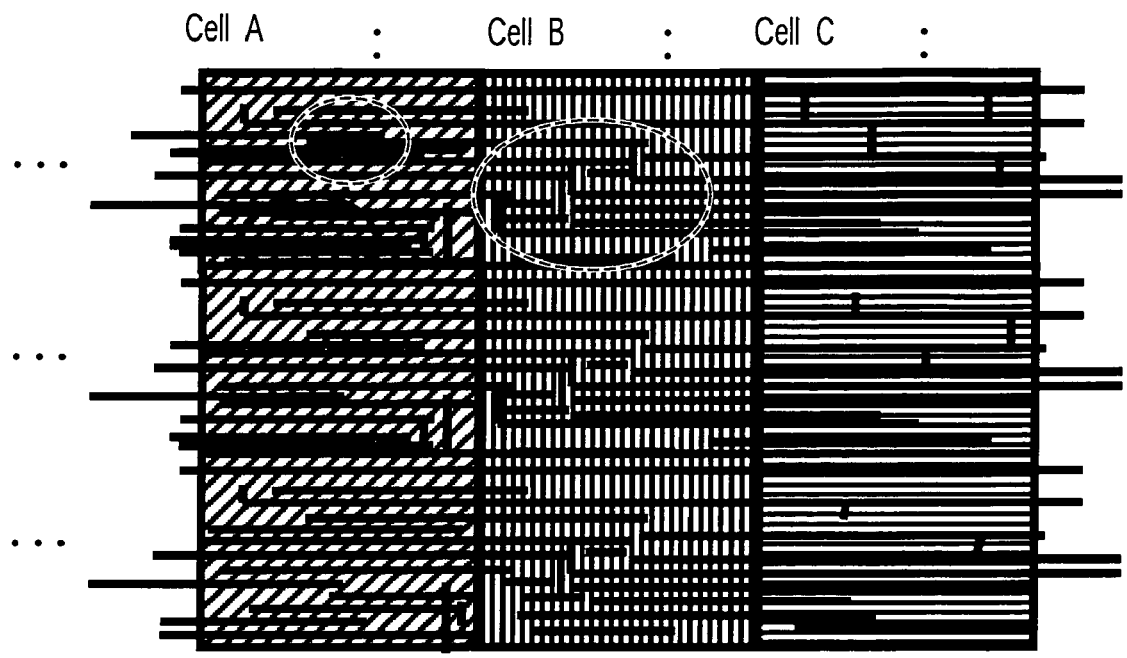
FIGS. 5A and 5B are schematic views of routing correction according to the first embodiment.
Figure 5B:
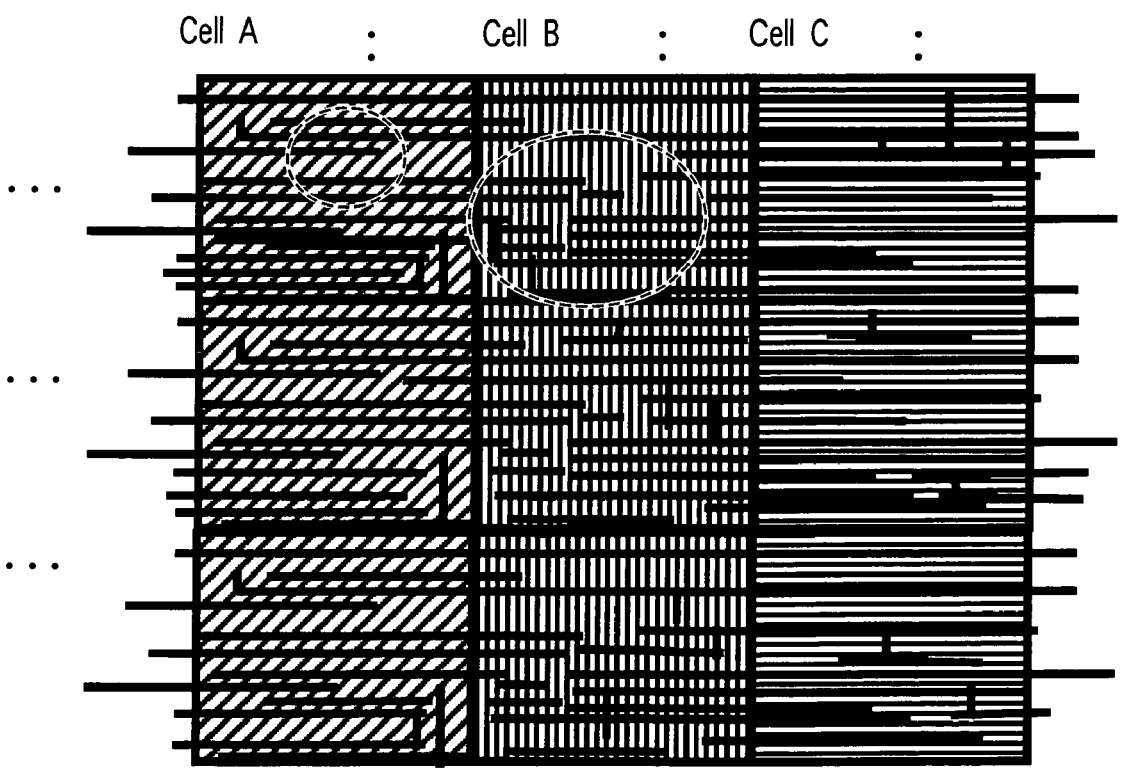

FIGS. 5A and 5B show an example of routing correction executed in this embodiment. In FIG. 5A, a process verification non-compliance point of routing detected in the process verification is indicated by a circle. This non-compliance point was finely corrected in accordance with the P & R design rule shown in FIG. 4 to eliminate the non-compliance point as shown in FIG. 5B. The correction here was executed by mainly ensuring the space for a portion with a high degree of routing congestion. The engine to execute the ECO process stores the rule and automatically corrects the dimensions in accordance with the rule that allows the process margin at the time of process. Hence, the process verification non-compliance points can automatically be corrected.

Figure 6:
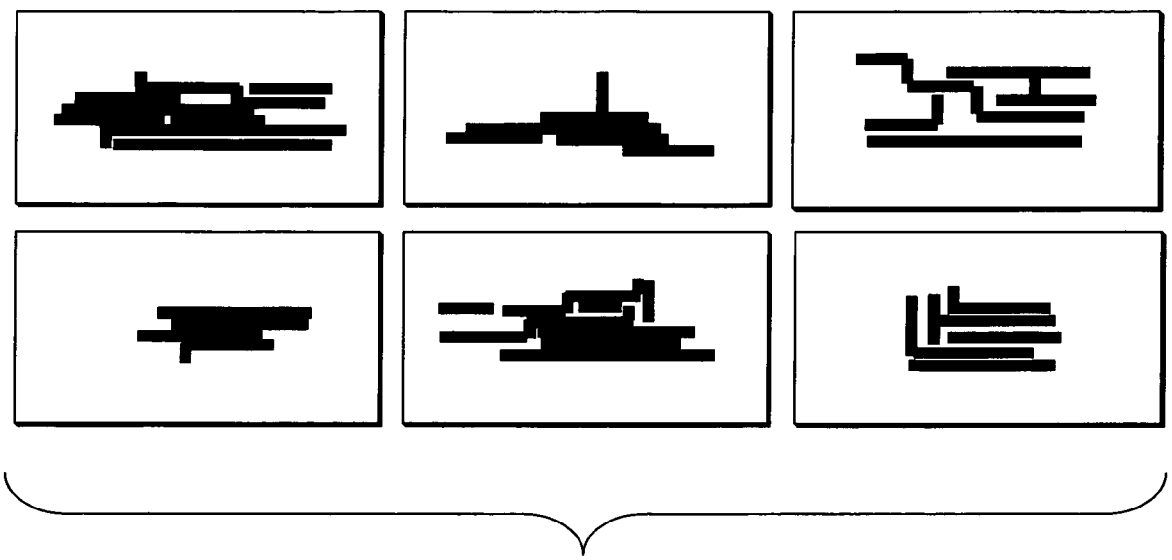
FIG. 6 is a view showing matching plates according to the first embodiment.

In place of the above-described graph (FIG. 3) showing the combinations of line width and space and the pattern correction guideline (FIG. 4) that shows an example of design rule, mask pattern data images as shown in FIG. 6, which correspond to process verification non-compliance points, may be used. In this case, the engine for the ECO process performs image matching so that a portion that matches the matching pattern shown in the example of FIG. 6 can automatically be corrected in accordance with an uniform rule.

If the line width, line length, or wiring layer has a problem, or the degree of routing congestion has a problem, the routing can be corrected by using the method of this embodiment. After mask tape out, i.e., after the process verification step, no wiring pattern non-compliance points were detected. In addition, since lithography information serving as a correction guideline is installed in the engine to execute the ECO process, the correction guideline can be used in processing masks of the same generation, and the load on verification (process verification step 15: category 4) immediately before mask tape out can greatly be reduced.

Even in processing masks of different types, routing non-compliance points can largely be reduced by the correction guideline corrected in advance. Conventionally, information about lithography is not fed back in routing between cells in pattern design. However, when feedback is executed by the method of this embodiment, correction can be done in consideration of the manufacturing process while maintaining the timing.

In this embodiment, the correction guideline for the ECO process is given as a graph and design rule. However, any other form capable of feeding back lithography information can be used. The graph in FIG. 3 and the design rule in FIG. 4 are not limited to these forms. FIG. 1 simply shows a part of the LSI design flow of this embodiment. However, the present invention is not limited to the flow shown in FIG. 1 if a form to feed back process verification information before mask data tape out to the ECO process can be implemented. The process margin and dimensional specification necessary for process verification are not limited to those described in this embodiment and can be set variously in accordance with the purpose of verification.

Second Embodiment

Figure 7:
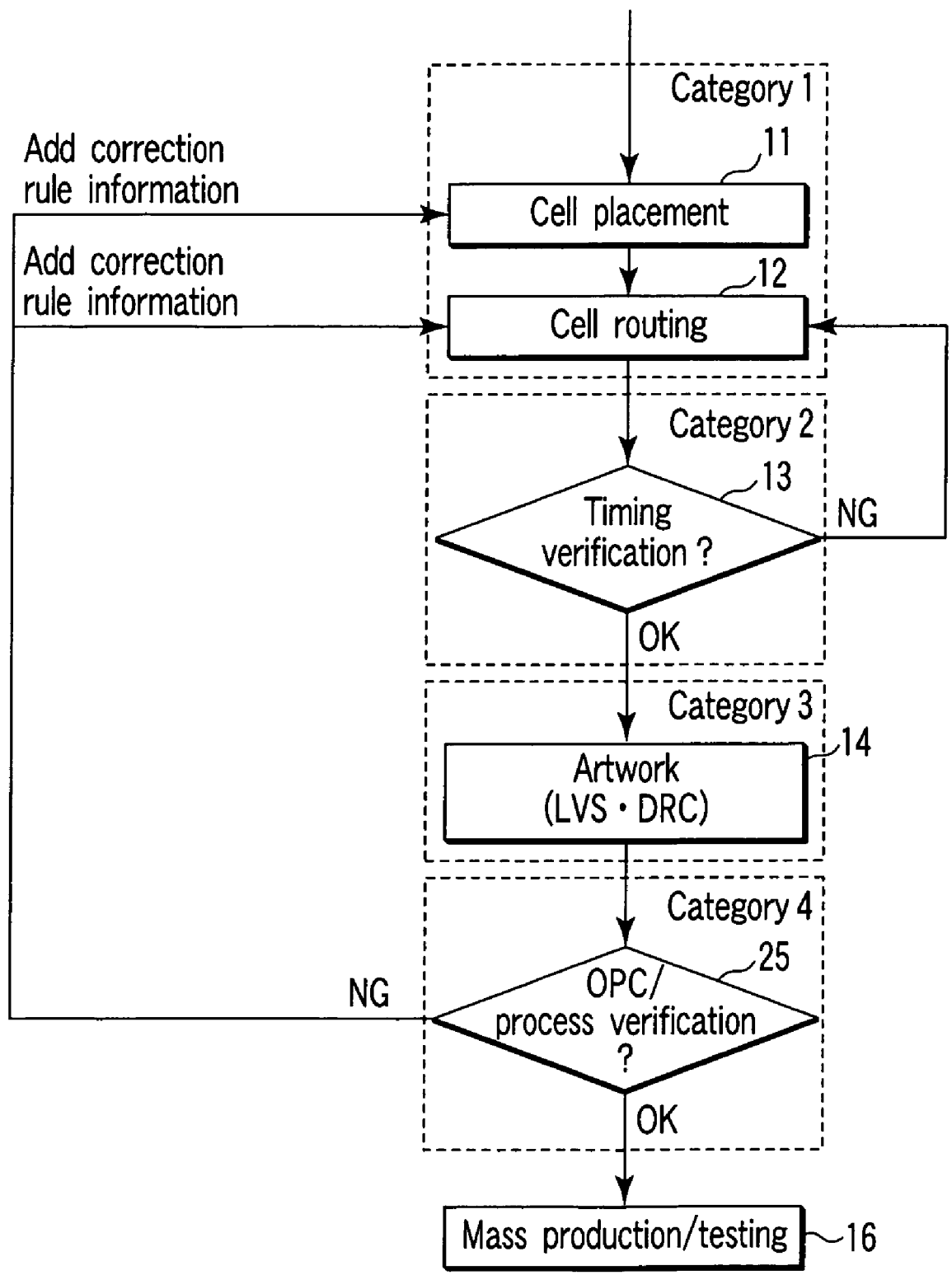
FIG. 7 is a flowchart showing a pattern data design method according to a second embodiment of the present invention.

FIG. 7 is a flowchart showing a pattern data design method according to the second embodiment of the present invention.

The design flow of the second embodiment is almost the same as that of the first embodiment shown in FIG. 1 except that an OPC/process verification step 25 is executed in place of the process verification step 15. That is, the flow of this embodiment is different from that of the first embodiment in that an OPC process is executed for a design pattern in process verification of the step 25. The flow is different from the conventional method in that the result of the OPC/process verification step 25 is fed back to a cell placement step 11 or cell routing step 12. The process flow of this embodiment will be described below.

Figure 8A:
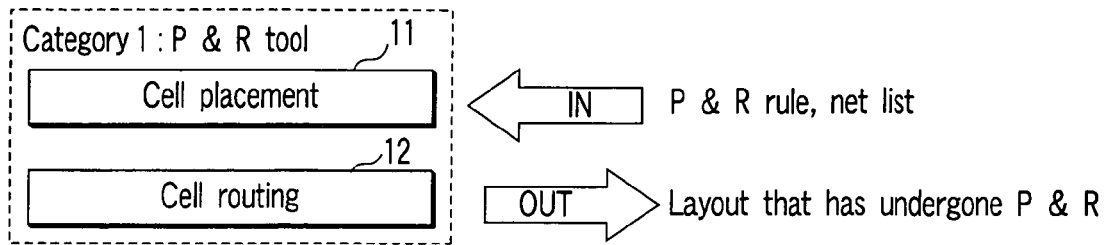
FIGS. 8A to 8D are views showing categories of the flow in FIG. 7 divided in accordance with the tools of processes.
Figure 8B:
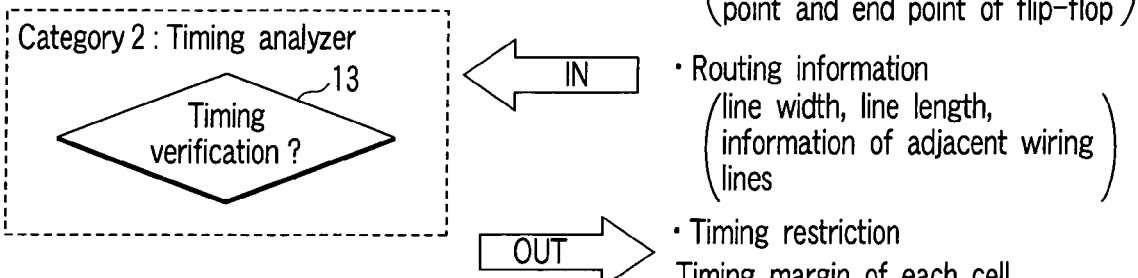
Figure 8C:
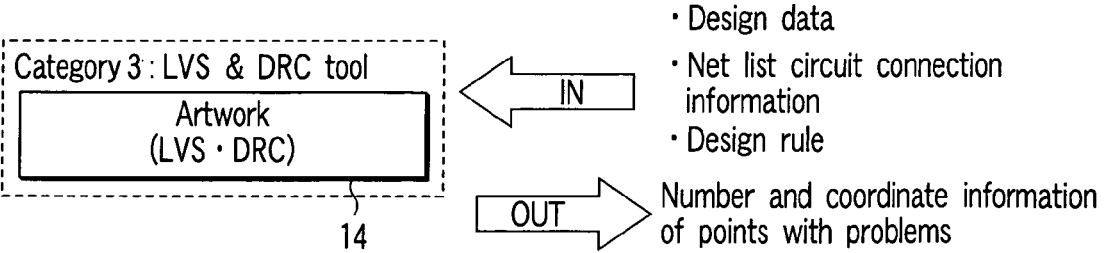
Figure 8D:
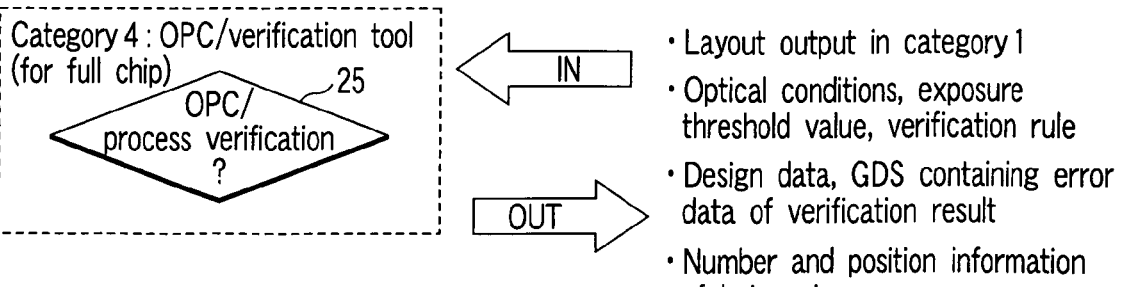

FIGS. 8A to 8D show categories of the flow in FIG. 7 divided in accordance with the tools of processes. As is apparent from comparison with FIGS. 2A to 2D, categories 1 to 3 in FIGS. 8A to 8C are the same as in the first embodiment. Category 4 shown in FIG. 8D is different from the first embodiment.

In the process of this embodiment, as category 1 a cell placement/routing process is executed by using a P & R tool, as shown in FIG. 8A, as in the first embodiment. In category 2, as shown in FIG. 8B, timing verification is executed for each cell by using a timing analyzer. If a timing verification non-compliance point is detected in category 2, the routing layout is corrected by the ECO process. A layout determined as OK by timing verification is subjected to artwork of category 3 using LVS and DRC tools and then to full-chip OPC/process verification of category 4.

In OPC/process verification (process verification step 25) of category 4, the layout output from the P & R tool of category 1, the optical conditions in exposure, the reference light intensity of the product (exposure threshold value), and the OPC/verification rule are input. Design data, a layout containing the error information of the verification result, and the number and position information of process verification non-compliance points are output. A process of, e.g., reducing the degree of routing congestion is executed for the non-compliance points of the verification result. Since errors that must be eliminated from the viewpoint of timing are already been corrected in category 2, the load on the full-chip verification in the process verification step is not so heavy. In addition, since OPC is executed for the design data, only a few hot spots are detected.

With the above-described series of processes, efficient pattern design can be executed from the viewpoint of both timing and lithography. Main processes of this embodiment corresponding to the process flow will be described below in detail.

In the pattern layout design stage, after the cell placement step 11 to artwork step 14, GDS data that had undergone artwork was subjected to optical proximity correction (OPC process). The GDS data that has undergone the OPC process was verified. Verification in this case indicates verification of the processes including lithography and etching conversion differences. In the verification, the displacement amount between the design pattern and the pattern to be formed on a wafer was calculated under the above-described optimum conditions of the product and conditions of various exposures and defocus amounts in the range of predetermined specifications of the product.

As the process margin of the product, the focal depth is ±0.15 μm, and the exposure margin is ±10%. The displacement amount between the design pattern and the pattern to be formed on a wafer was calculated by using the method described in Jpn. Pat. Appln. KOKAI Publication No. 2004-279997. It was found that a dimensional specification (e.g., 10 nm) allowable for the product within the process margin was not satisfied at a number of points, and these portions were hard to avoid by the OPC process.

In addition, for the process verification non-compliance points, the displacement amount was calculated under the conditions of various exposures and defocus amounts within the process margin. By monitoring the average value and variation of the displacement amounts, it was determined whether the process verification non-compliance points were correctable by OPC and whether layout correction was necessary. By using this method, of the process verification non-compliance points of the product, points with large variations in displacement amount, i.e., points without the margin were determined as portions that required layout correction.

In this embodiment, most points that required layout correction were routing portions. Hence, the process verification non-compliance points after OPC were corrected by the ECO process after detailed routing. First, the position coordinates of the points with the unsatisfactory dimensional specification were prepared. Next, a graph (FIG. 3) was prepared, which represented combinations of line width and space allowable when considering the process margin. Instead of using the graph shown in FIG. 3, information may be fed back in a form of a P & R design rule shown in FIG. 4.

Routing correction of this embodiment is the same as that shown in FIGS. 5A and 5B of the first embodiment. More specifically, OPC is executed for cell routing, and the layout of the process verification non-compliance points was finely corrected in accordance with the P & R design rule shown in FIG. 4. When the engine to execute the ECO process stores the design rule, the line width can automatically be corrected in accordance with the design rule that allows the lithography margin in the ECO process.

Mask pattern data images shown in, e.g., FIG. 6, which correspond to non-compliance points, may be used as the pattern correction guideline. In this case, the engine for the ECO process performs image matching so that a layout portion that matches the pattern can automatically be corrected in accordance with an uniform rule.

If the line width, line length, or wiring layer has a problem, or the degree of routing congestion has a problem, the routing can be corrected by using the method of this embodiment. After mask tape out, no wiring pattern non-compliance points were detected. In addition, the load generated by iteration of OPC was eliminated. Since lithography information serving as a correction guideline is installed in the engine to execute the ECO process, the correction guideline can be used in processing masks of the same generation, and the load on verification (OPC/process verification step 25: category 4) immediately before mask tape out can greatly be reduced.

Even in processing masks of different types, routing non-compliance points can largely be reduced by the correction guideline corrected in advance. Conventionally, information about lithography is not fed back in detailed routing in pattern design. However, when feedback is executed by the method of this embodiment, correction can be done in consideration of the manufacturing process while maintaining lithography.

In this embodiment, the correction guideline for the ECO process is given as a graph and design rule. However, any other form capable of feeding back lithography information can be used. The graph in FIG. 3 and the design rule in FIG. 4 are not limited to these forms. FIG. 7 simply shows a part of the LSI design flow of this embodiment. However, the present invention is not limited to the flow shown in FIG. 7 if a form to feed back OPC/verification information before mask data tape out to the ECO process can be implemented. The process margin and dimensional specification necessary for process verification are not limited to those described in this embodiment and can be set variously in accordance with the purpose of verification.

Third Embodiment

Figure 9:
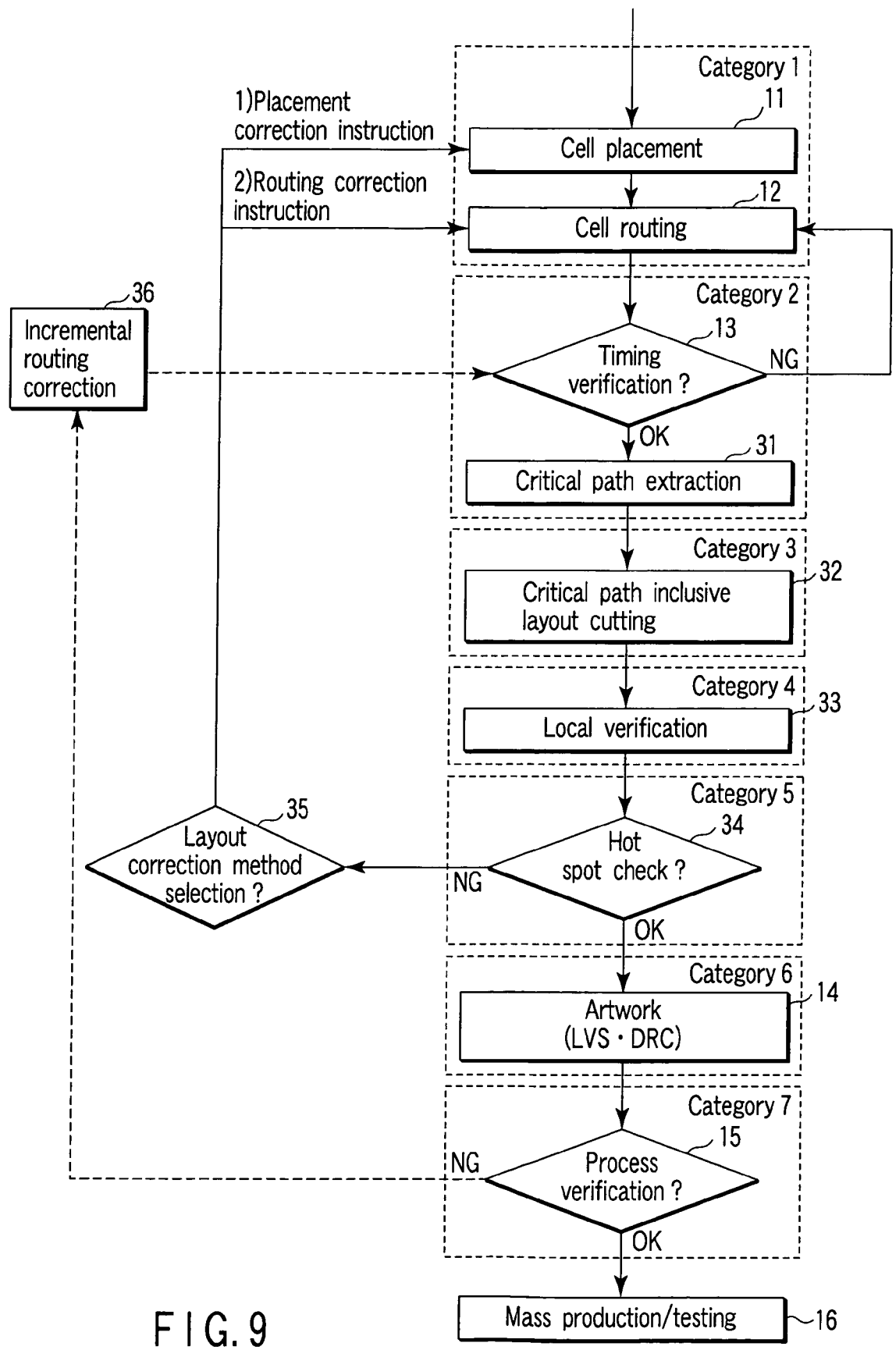
FIG. 9 is a flowchart showing a pattern data design method according to a third embodiment of the present invention.

FIG. 9 is a flowchart showing a pattern data design method according to the third embodiment of the present invention.

The third embodiment is different from the first embodiment in that a critical path extraction step 31 is executed after a cell placement step 11 to timing verification step 13 of the first embodiment to selectively verify the area around the critical path. For this purpose, a critical path inclusive layout cutting step 32, local verification step 33, hot spot check step 34, layout correction method selection step 35, and incremental routing correction step 36 are added.

Figure 10A:
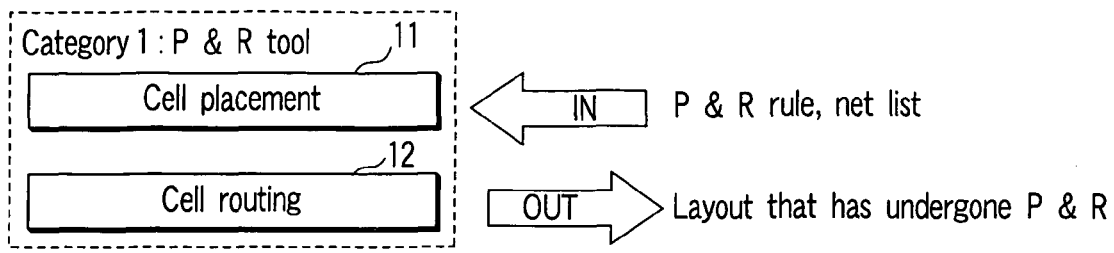
FIGS. 10A to 10D and 11A to 11C are views showing categories of the flow in FIG. 9 divided in accordance with the tools of processes.
Figure 10B:
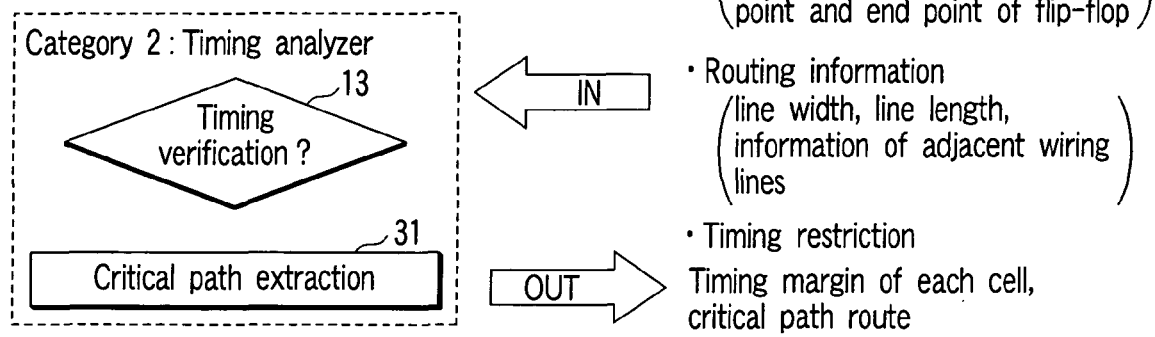

FIGS. 10A to 10D and 11A to 11C show categories of the flow in FIG. 9 divided in accordance with the tools of processes. In the process of this embodiment, as category 1 (steps 11 and 12), a cell placement/routing process is executed by using a P & R tool, as shown in FIG. 10A, as in the first embodiment. In category 2 (steps 13 and 31), as shown in FIG. 10B, timing verification is executed for each cell by using a timing analyzer for layout optimization. Input to this tool contains net list connection information representing the propagation time along the distance between the start point and the end point of a flip-flop, routing information including a line width, line length, and information of adjacent wiring lines, and timing restriction. On the basis of the input information, the timing analyzer calculates the delay in each path and compares the calculation result with the timing restriction, thereby outputting a timing margin of each path. In addition, the route of the critical path is specified from the delay calculation result.

Figure 10C:
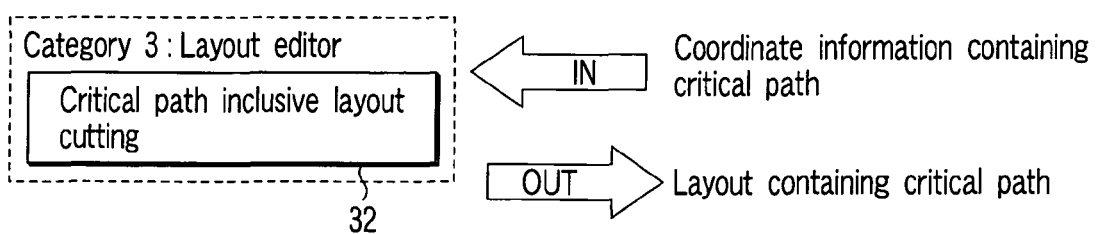
Figure 10D:
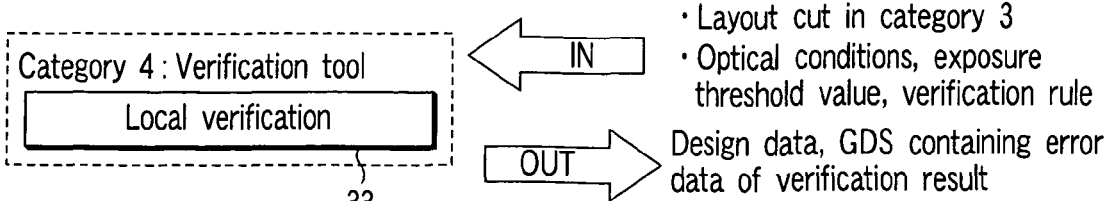

In category 3 (step 32), as shown in FIG. 10C, the critical path portion extracted in category 2 and the layout around it are cut by using a layout editor. In category 4 (step 33), as shown in FIG. 10D, process verification is executed, by using a verification tool, for the design data around the critical path output in category 3. Input to the verification tool contains the design data output in category 3, optical conditions of the product to be processed, the threshold value of the product, and the verification rule. After verification, the verification tool outputs the design data and a polygon of the simulation result in verification.

Figure 11A:
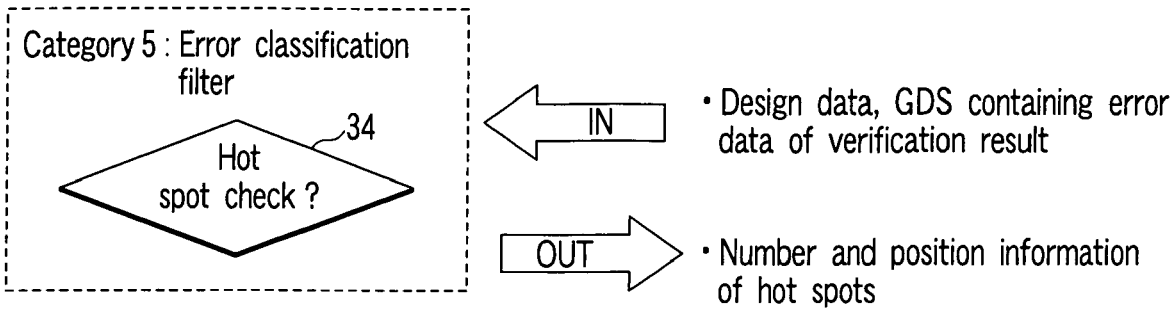
Figure 11B:
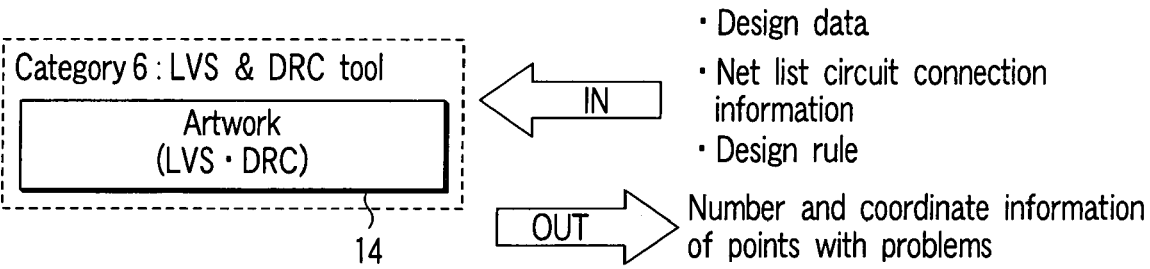
Figure 11C:
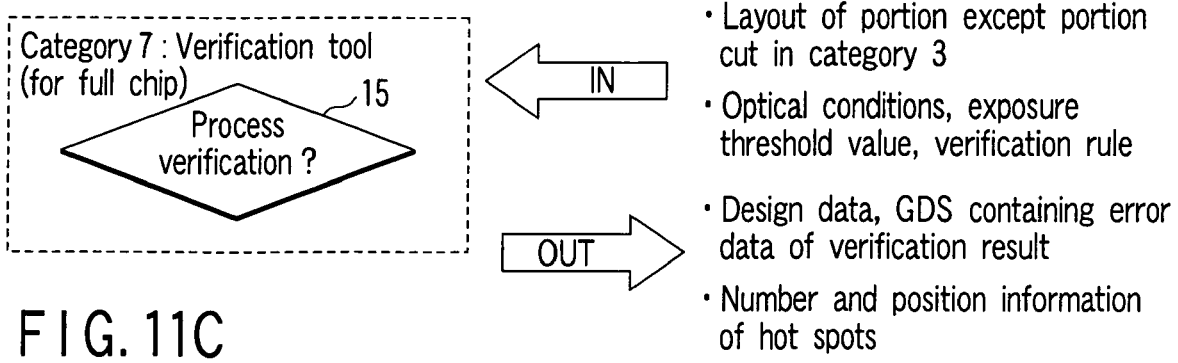

In category 5 (step 34), as shown in FIG. 11A, error results output from the verification tool are classified by an error classification filter, and danger point information (number and coordinates of hot spots) is extracted. On the basis of the hot spot information, correction is executed from the viewpoint of lithography. In category 6 (step 14), artwork is executed by using LVS and DRC tools, as shown in FIG. 11B. In category 7 (step 15), process verification for the full chip (full-chip verification) is executed by using a verification tool, as shown in FIG. 11C.

Since errors of critical portions which are important for guaranteeing the cell performance are eliminated in category 4, the load on the full-chip verification in category 7 is not so heavy. In addition, since category 4 is a step prior to artwork, the correction method can be set relatively flexibly. That is, the cell placement or routing portions can be corrected.

With the above-described series of processes, efficient pattern design can be executed from the viewpoint of both timing and lithography. Main processes of this embodiment corresponding to the process flow will be described with an emphasis on steps different from the normal method.

Critical paths, which are extracted as a result of timing analysis as paths to determine the delay value of the cell, account for about 20% of the whole cell area. Hence, selectively verifying the critical path portions which must preferentially be taken into consideration to satisfy the timing restriction does not largely increase the load on the turnaround time of the design. When process verification can be fed back for only the critical path portions, layout correction can be completed in an earlier stage of the design flow in consideration of the timing of the design pattern and the manufacturing process. Additionally, since the narrowing condition of process verification can be relaxed in full-chip process verification of category 7, the number of iteration of the process between process verification and routing correction can be reduced. Hence, the process verification can be decreased.

After critical path extraction in category 2 of the flow shown in FIG. 9, the GDS data of the critical path portions and the GDS data of the peripheral portions were output in different layers to discriminate between them. For the outpour GDS data, the displacement amount was calculated under the same conditions as in the first embodiment. The selective verification process in this case can be implemented by using a known method. Consequently, points which did not satisfy the dimensional specification allowable within the process margin were detected from the critical path routing portions. If process verification non-compliance points are detected in this stage, hot spot check of category 5 is executed, and a correction method corresponding to the contents of errors is selected. More specifically, if the cell placement has a problem because of the intra-cell pattern, incremental placement correction is executed. If the line width, line length, or wiring layer has a problem, or the degree of routing congestion has a problem, incremental cell routing correction is executed.

Figure 12A:
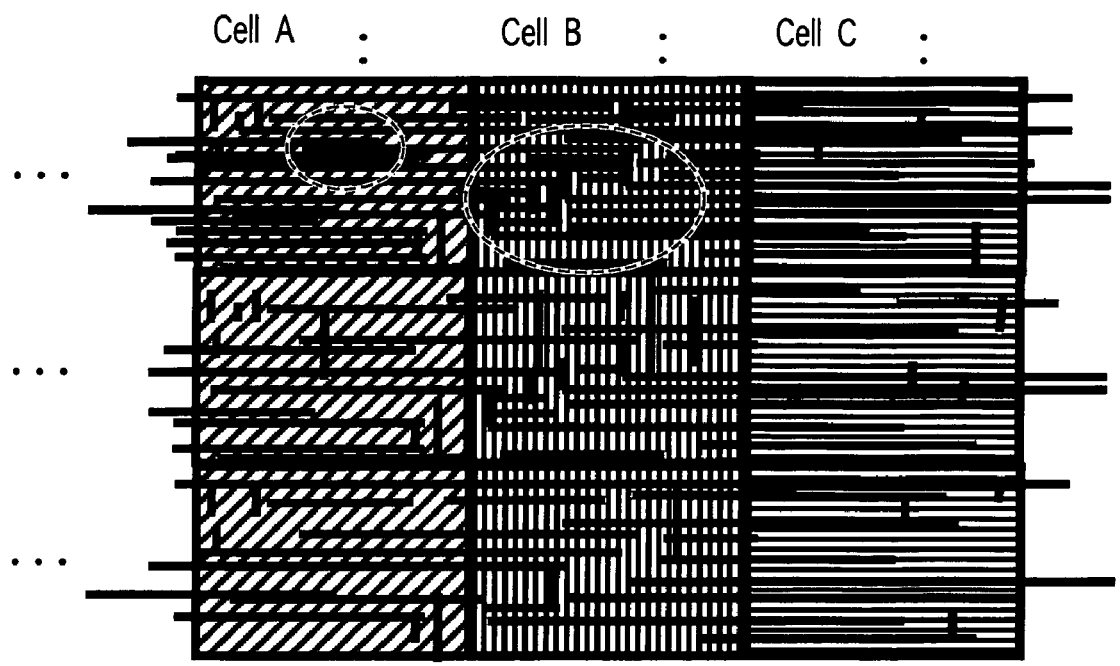
Figure 12B:
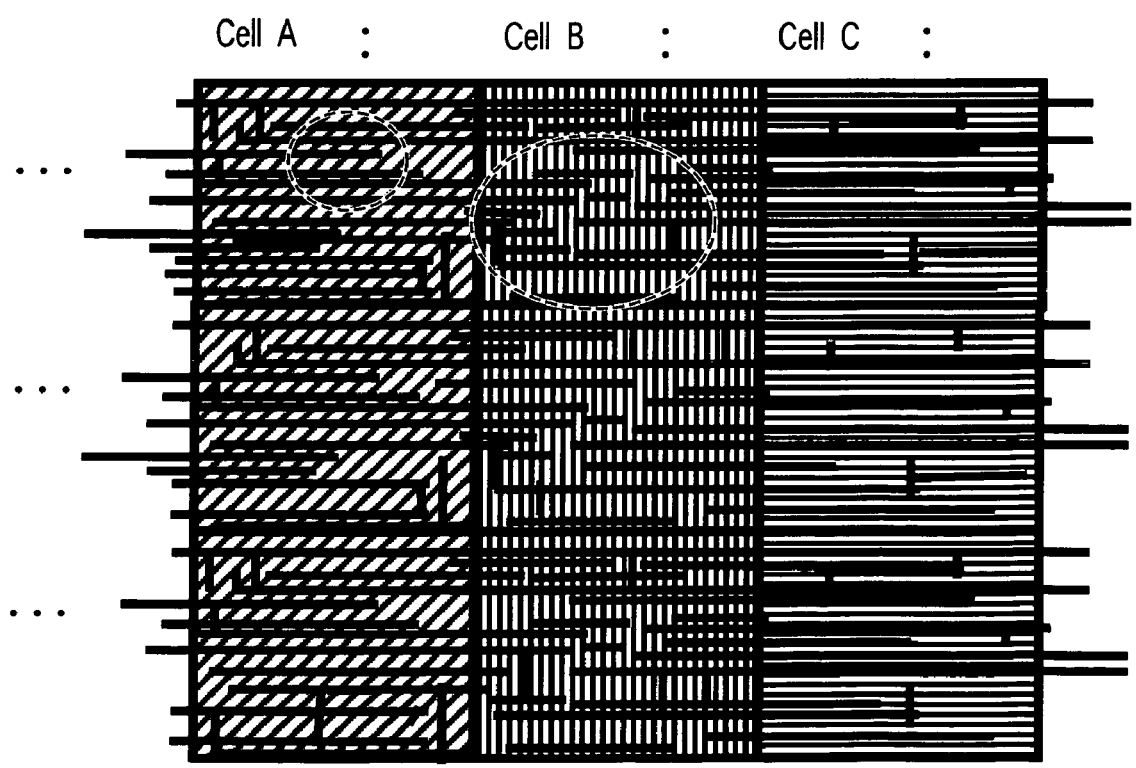

In this embodiment, cell routing correction was done. Hence, the same correction as in the first embodiment is done by using the coordinates of the process verification non-compliance points and the design rule (FIGS. 3 and 4) used in the first embodiment. FIGS. 12A and 12B show an example of correction in this embodiment. In FIG. 12A, a process verification non-compliance point of cell routing of a portion related to a critical path is indicated by a circle. For this non-compliance point, the P & R design rule shown in the example of FIG. 4 was input to the engine to execute the ECO process, and the pattern was corrected. FIG. 12B shows the correction result in which the non-compliance point is improved.

Correction by hot spot check of this embodiment is executed before artwork. As compared to fine correction in the first and second embodiments, many kinds of correction can be executed by, e.g., changing the routing scheme or changing the rule. In this embodiment, routing non-compliance points are detected. However, since correction is done before artwork, cell placement can also be corrected.

FIGS. 13A to 13C show an example of cell placement correction. For cells A-B-C placed as shown in FIG. 13A, a process verification non-compliance point is detected in cell routing indicated by a circle. When the cell placement is changed to B-C-A as shown in FIG. 13B, the process verification non-compliance point in the cell routing is eliminated. Even when the cells A and C are replaced to obtain a cell placement A'-B-C' as shown in FIG. 13C, the process verification non-compliance point can be eliminated.

In this embodiment, since pattern correction is executed after critical path extraction, the correction method can be set variously especially for the pattern around the critical path. In addition, errors of critical path portions can be eliminated in an earlier stage, the timing converges quickly, and the turn-around time of the entire pattern layout can be shortened.

In the layout which has undergone correction of only critical path portions, the process verification in category 7 (step 15) was executed again for a layout except the peripheral area of the critical paths. The verification conditions are the same as in the first embodiment. Since portions except the critical paths were subjected to the process, the tolerance setting of dimensional specification was relaxed from 10 nm to 15 nm. As a result, convergence by the process simulator was quick, and the turnaround time of the verification process could be greatly be shortened.

In this embodiment, the correction guideline for the ECO process is given as a graph (FIG. 3) and design rule (FIG. 4). However, any other form capable of feeding back process verification information can be used. The graph in FIG. 3 and the design rule in FIG. 4 are not limited to these forms. FIG. 9 simply shows a part of the LSI design flow of this embodiment. However, the present invention is not limited to the flow shown in FIG. 9 if a form to feed back process verification information before mask data tape out to the ECO process can be implemented. The process margin and dimensional specification necessary for two cycles of process verification are not limited to those described in this embodiment and can be set variously in accordance with the purpose of verification by employing the same or different conditions.

In this embodiment, the layout of a critical path portion important from the viewpoint of timing was selectively corrected. If the critical path portion cannot be changed, cell replacement and routing correction can selectively be done for a layout of a portion except the critical path portion. In any case, the critical path portions and other portions are in different layers. Hence, a layer for cell replacement and routing correction can be selected and processed in accordance with the purpose.

Fourth Embodiment

Figure 14:
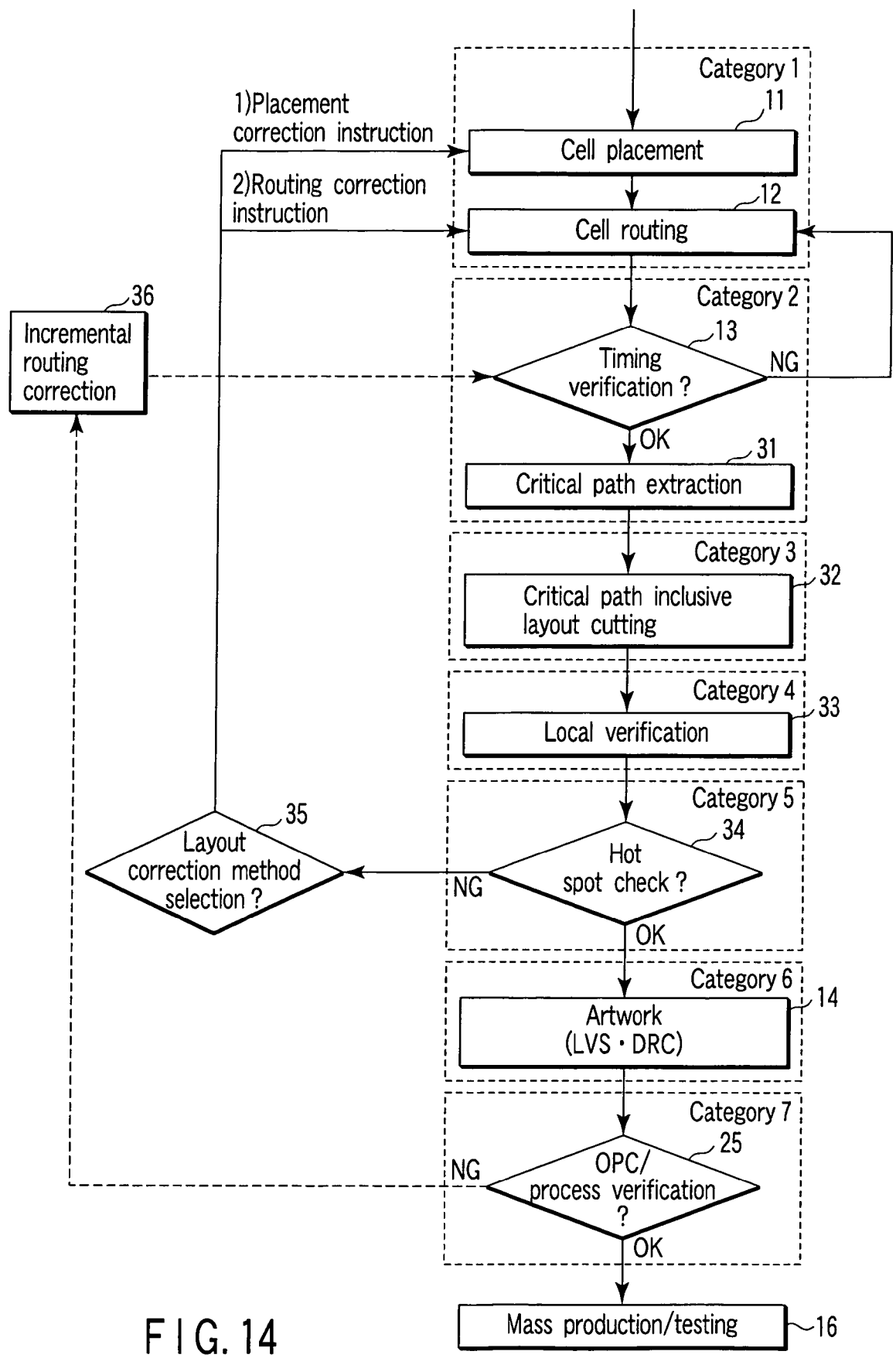
FIG. 14 is a flowchart showing a pattern data design method according to a fourth embodiment of the present invention.

FIG. 14 is a flowchart showing a pattern data design method according to the fourth embodiment of the present invention.

The design flow of the fourth embodiment is almost the same as that of the third embodiment shown in FIG. 9 except that an OPC/process verification step 25 is executed in place of the process verification step 15. That is, the flow of this embodiment is different from that of the third embodiment in that an OPC process is executed selectively for an area around a critical path in process verification of the step 25. The process flow of this embodiment will be described below.

FIGS. 15A to 15D and 16A to 16C show categories of the flow in FIG. 14 divided in accordance with the tools of processes.

In the process of this embodiment, as category 1 (steps 11 and 12), a placement/routing process is executed by using a P & R tool, as shown in FIG. 15A, as in the third embodiment. In category 2 (steps 13 and 31), as shown in FIG. 15B, timing verification is executed for each cell by using a timing analyzer for layout optimization. Input to the timing analyzer contains net list connection information representing the propagation time along the distance between the start point and the end point of a flip-flop, routing information including a line width, line length, and information of adjacent wiring lines, and timing restriction. On the basis of the input information, the timing analyzer calculates the delay in each path and compares the calculation result with the timing restriction, thereby outputting a timing margin of each path. In addition, the route of the critical path is specified from the delay calculation result.

In category 3 (step 32), as shown in FIG. 15C, the critical path portion extracted in category 2 and the layout around it are cut by using a layout editor. In category 4 (step 33), as shown in FIG. 15D, the design data around the critical path output in category 3 is subjected to OPC and then to process verification by using an OPC/verification tool. Input to the OPC/verification tool contains the design data output in category 3, optical conditions of the product to be processed, the threshold value of the product, and the OPC/verification rule. After verification, the OPC/verification tool outputs the design data, data that has undergone OPC, and a polygon of the simulation result in verification.

Figure 16A:
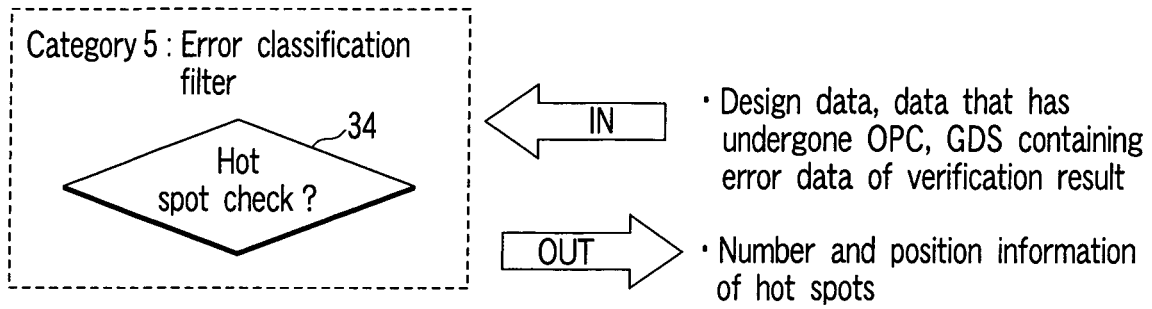
Figure 16B:
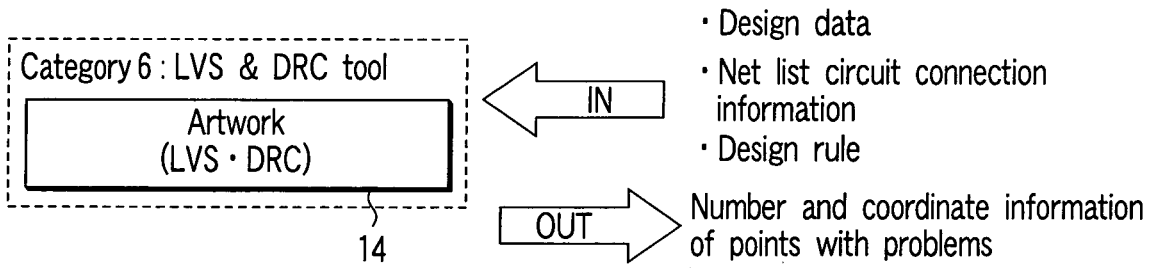
Figure 16C:
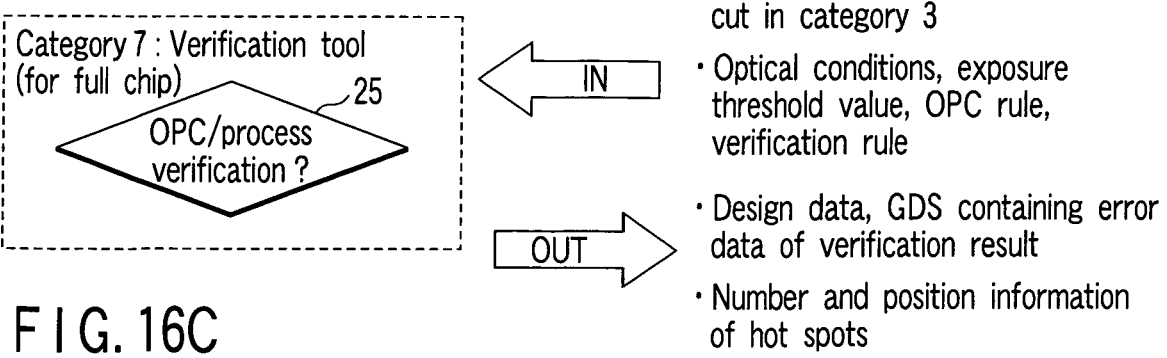

In category 5 (step 34), as shown in FIG. 16A, error results output from the verification tool are classified by an error classification filter, and hot spot information (number and coordinates of hot spots) is extracted. On the basis of the hot spot information, correction is executed from the viewpoint of lithography. In category 6 (step 14), artwork is executed by using LVS and DRC tools, as shown in FIG. 16B. In category 7 (step 25), OPC is executed for the full chip, and then, process verification is executed, as shown in FIG. 16C.

Since errors of critical portions which are important for guaranteeing the cell performance are eliminated in category 4, the load on the full-chip verification in the OPC/process verification of category 7 is not so heavy. In addition, since category 4 is a step prior to artwork, the correction method can be set relatively flexibly. That is, the cell placement or routing portions can be corrected incrementally.

With the above-described series of processes, efficient pattern design can be executed from the viewpoint of both timing and lithography. Main processes of this embodiment corresponding to the process steps will be described with an emphasis on steps different from the normal method.

Critical paths, which are extracted as a result of timing analysis as paths to determine the delay value of the cell, account for about 20% of the whole cell area. Hence, selectively executing the OPC process and then the process verification for the critical path portions which must preferentially be taken into consideration to satisfy the timing restriction does not largely increase the load on the turnaround time of the design. When the OPC process/verification and its feedback can be done for only the critical path portions, layout correction can be completed in an earlier stage in consideration of the timing. Additionally, since the narrowing condition can be relaxed in full-chip OPC and lithography verification in the succeeding stage from the viewpoint of process, the number of iteration of the process between process verification and routing correction can be reduced. Hence, the process load in process verification can be decreased.

After critical path extraction in category 2 of the flow shown in FIG. 14, this portion was output in category 4 with GDS information being changed. An example of GDS information is a layer number. For the selected GDS information, the OPC process and lithography verification process were executed under the same conditions as in the first embodiment. The OPC process in this case can be implemented by using a known method.

When process verification was executed for the pattern after the OPC process, points which did not satisfy the dimensional specification (e.g., 10 nm) allowable within the process margin were detected from the critical path routing portions. If process verification non-compliance points are detected in this stage, the hot spot check step 34 is executed, and a correction method corresponding to the contents of errors is selected. More specifically, if the cell placement has a problem because of the intra-cell pattern, incremental placement correction is executed. If the line width, line length, or wiring layer has a problem, or the degree of routing congestion has a problem, incremental cell routing correction is executed.

Figure 17A:
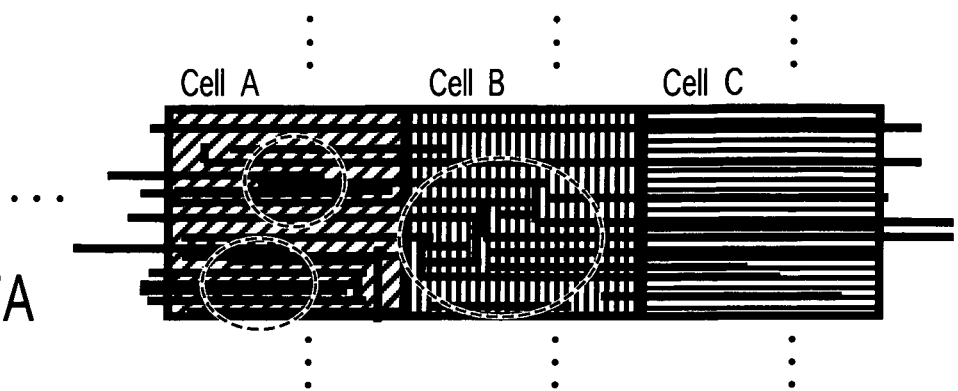
FIGS. 17A to 17D are schematic views of routing correction according to the fourth embodiment.
Figure 17B:
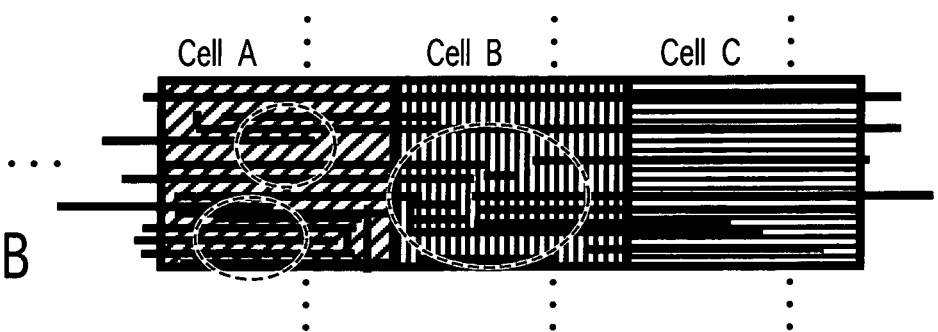
Figure 17C:
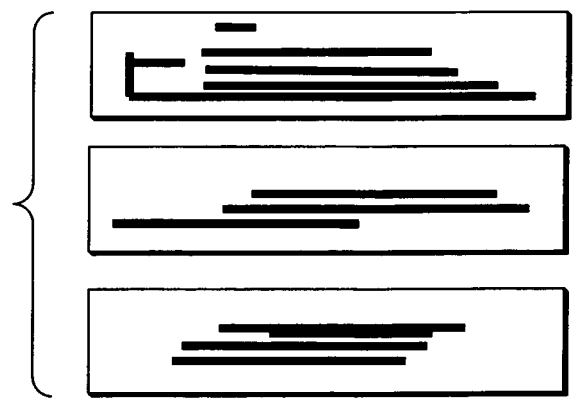
Figure 17D:
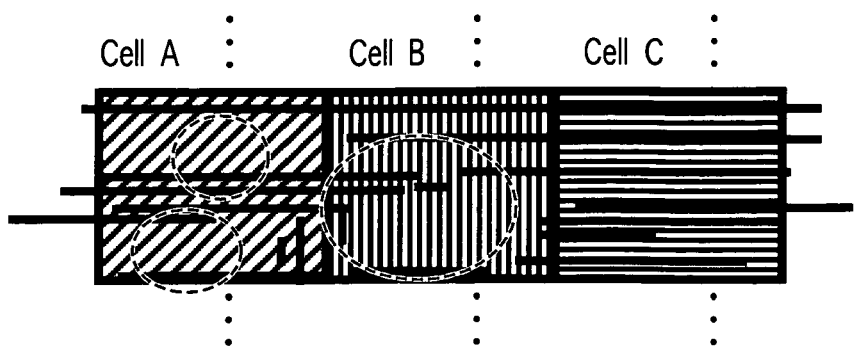

In this embodiment, an error of a cell routing portion was detected. Hence, the same correction as in the third embodiment is done by using the coordinates of the process verification non-compliance points and the design rule (FIGS. 3 and 4) used in the first embodiment. That is, the cell routing is corrected as shown in FIGS. 5A and 5B and FIGS. 12A and 12B. In this embodiment, the OPC process after layout correction is executed by using different rules. Hence, the corrected portions are output in different layers. This is shown in FIGS. 17A to 17D. A process verification non-compliance point indicated by a circle in FIG. 17A is corrected as shown in FIG. 17B. The layout around the corrected portion is cut, as shown in FIG. 17C. FIG. 17D shows the cut layout (around the critical path) and a layout except the cut layout.

As described above, the OPC process of the layout shown in FIG. 17C and the OPC process of the layout shown in FIG. 17D are executed in accordance with different rules. FIG. 17D shows a portion except the critical path. Hence, the OPC process can be executed by using a more relaxed rule than in FIG. 17C.

In this embodiment, since pattern correction is executed after critical path extraction, the correction method can be set variously especially for the pattern around the critical path. In addition, errors of critical path portions can be eliminated in an earlier stage, the timing converges quickly, and the OPC rule for the layout except the critical path can be relaxed.

Hence, the number of iteration of the OPC process can be reduced, and the turnaround time of the entire pattern design can be shortened.

In the layout which has undergone correction of only critical path portions, the process verification in category 7 (step 25) was executed again for a layout except the peripheral area of the critical paths. The OPC/verification conditions are the same as in the first embodiment. Since the critical path portion were already extracted, the tolerance setting of dimensional specification was relaxed from 10 nm to 15 nm. As a result, convergence by the process simulator was quick, and the turnaround time of the OPC/verification process could be greatly be shortened.

In this embodiment, the correction guideline for the ECO process is given as a graph (FIG. 3) and design rule (FIG. 4). However, any other form capable of feeding back process verification information can be used. The graph in FIG. 3 and the design rule in FIG. 4 are not limited to these forms. FIG. 14 simply shows a part of the LSI design flow of this embodiment. However, the present invention is not limited to the flow shown in FIG. 14 if a form to feed back OPC/process verification information before mask data tape out to the ECO process can be implemented. The process margin and dimensional specification necessary for two cycles of process verification are not limited to those described in this embodiment and can be set variously in accordance with the purpose of verification by employing the same or different conditions.

In this embodiment, the layout of a critical path portion important from the viewpoint of timing was selectively corrected. If the critical path portion cannot be changed, cell replacement and routing correction can selectively be done for a layout of a portion except the critical path portion. In any case, the critical path portions and other portions are in different layers. Hence, a layer for cell replacement and routing correction can be selected and processed in accordance with the purpose.

Fifth Embodiment

Figure 18:
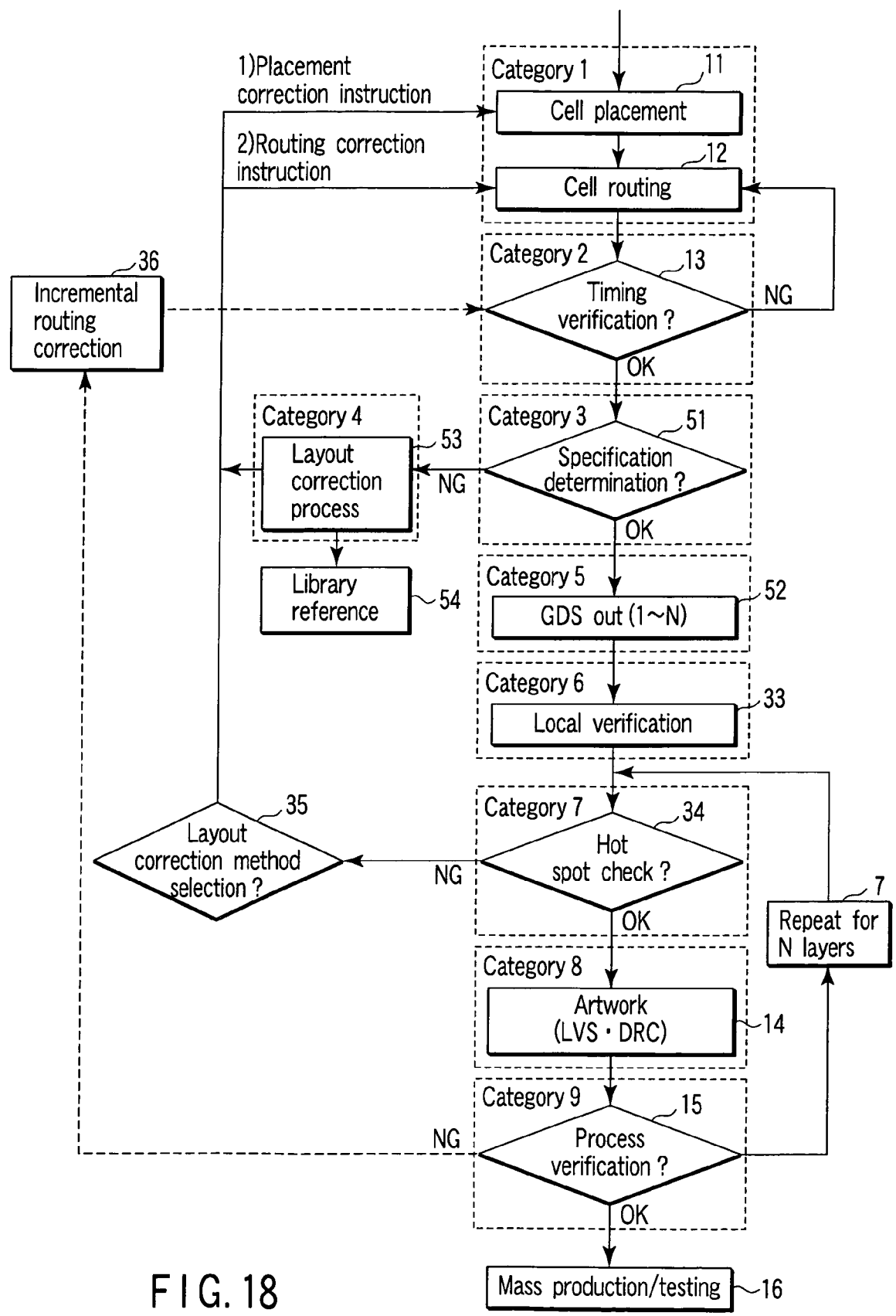
FIG. 18 is a flowchart showing a pattern data design method according to a fifth embodiment of the present invention.

FIG. 18 is a flowchart showing a pattern data design method according to the fifth embodiment of the present invention.

In the conventional method, the steps from cell placement to process verification are executed continuously. The fifth embodiment is different from the conventional method and the first to fourth embodiments in that the timing margin is compared with specifications after a timing analysis step 13, and the comparison result is fed back to placement correction and routing correction after referring to a library. In place of the critical path extraction step 31 and layout cutting step 32 in FIG. 14 of the third embodiment, a specification determination step 51, GDS output step 52, layout correction process step 53, and library reference step 54 are provided.

FIGS. 19A to 19E and 20A to 20C show categories of the flow in FIG. 18 divided in accordance with the tools of processes.

Figure 19A:
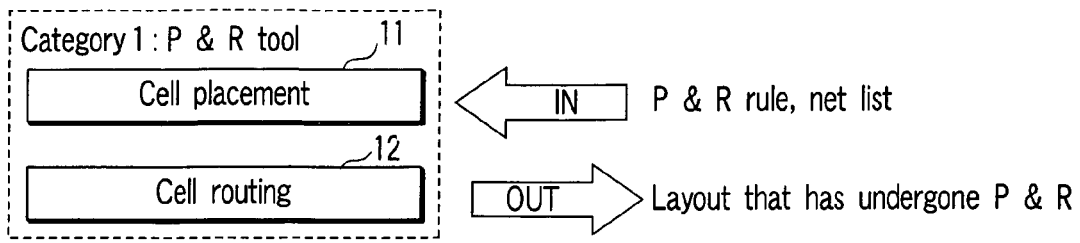
FIGS. 19A to 19E and 20A to 20C are views showing categories of the flow in FIG. 18 divided in accordance with the tools of processes.
Figure 19B:
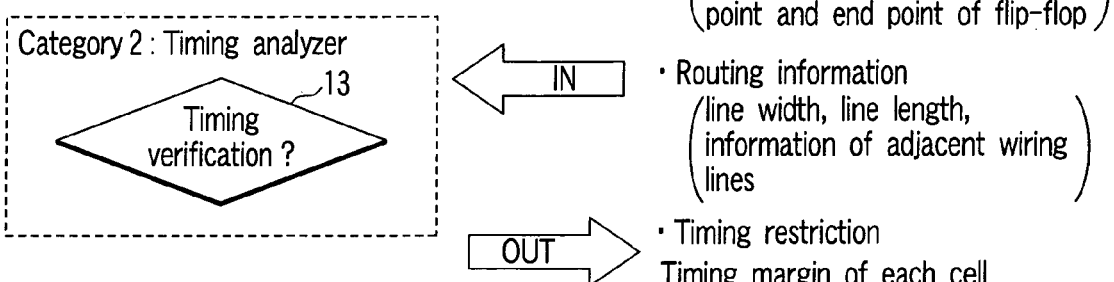

In the process of this embodiment, as category 1 (steps 11 and 12), a cell placement/routing process is executed by using a P & R tool, as shown in FIG. 19A, as in the first embodiment. In category 2 (step 13), as shown in FIG. 19B, timing verification is executed for each cell designed on the basis of a typical design rule (DR) by using a timing analyzer for layout optimization. Input to the timing analyzer contains net list connection information representing the propagation time along the distance between the start point and the end point of a flip-flop, routing information including a line width, line length, and information of adjacent wiring lines, and timing restriction. On the basis of the input information, the timing analyzer calculates the delay in each path and compares the calculation result with the timing restriction, thereby outputting a timing margin of each path. In addition, the route of the critical path is specified from the delay calculation result.

Figure 19C:
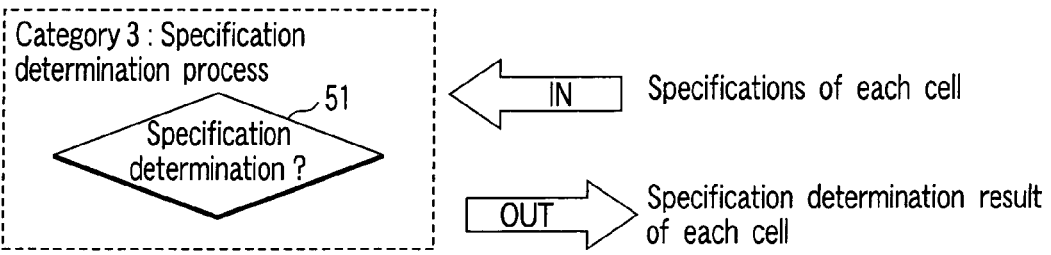

In category 3 (step 51), as shown in FIG. 19C, the magnitude of the timing margin is checked by using a specification determination process tool on the basis of the timing analysis result in category 2, the layout after placement/routing, and the timing specifications. A cell in which the timing margins of all paths almost match the standard value (set in advance) is directly subjected to the process of the next category without executing any special process. On the other hand, for a cell which is determined by timing analysis to have no sufficient margin or already include a path that does not satisfy the margin specifications, cell replacement is executed by referring to a cell library.

FIG. 21 shows the contents of the cell library used in this embodiment. In the cell library, a cell designed by using a design rule thicker (more lenient) than the typical design rule and a cell designed by using a design rule thinner (stricter) than the typical design rule are prepared as replacement cells. In addition, a delay, power consumption data, delay center value, and standard deviation of each cell are registered in advance. A line width, space, delay center value, and standard deviation of each wiring line are also registered. A cell having no sufficient margin on the slower side was replaced with the cell designed by the design rule more lenient than the typical design rule. Conversely, a cell including a path with a sufficient margin was replaced with the cell designed by the design rule stricter than the typical design rule. Since each cell had a plurality of paths, a reference for replacement was provided.

More specifically, it is mainly a critical path specified by the timing analyzer that must consider change to the design rule stricter than the typical design rule. To the contrary, as long as the critical path satisfies the timing restriction, the remaining portions can be replaced with the cell designed by the design rule more lenient than the typical design rule while referring to the timing result. The replacement cells are normally prepared before placement/routing. Statistical timing data of cells to be placed/routed are collected, and replacement cells are prepared for a cell which frequently includes a critical path. With this arrangement, process verification converges quickly, and the turnaround time of verification can be shortened.

Figure 19D:
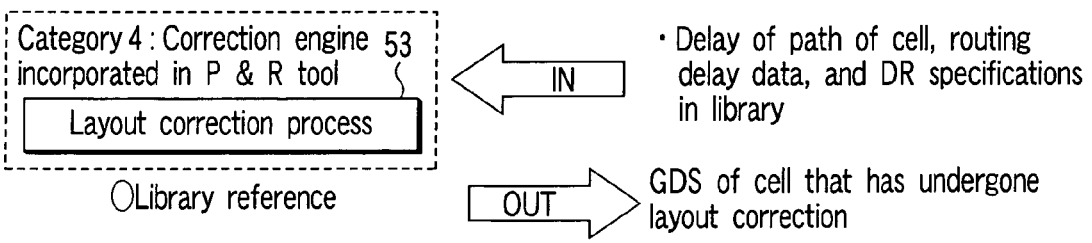
Figure 19E:
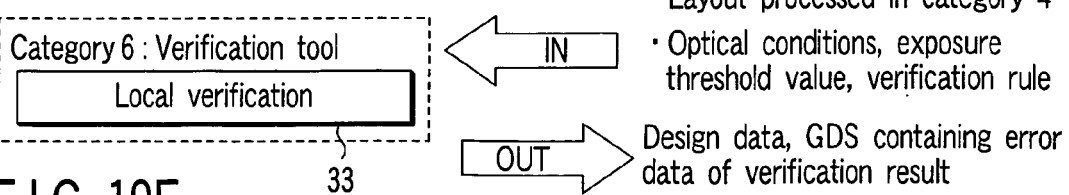

In category 4 (step 53), as shown in FIG. 19D, the correction engine in the P & R tool corrects the layout (replaces cells and corrects routing). The design data of the corrected portion is output. In category 6 (step 33), as shown in FIG. 19D, process verification is executed for each layer by using a verification tool. Input to the verification tool contains the design data output in category 4, optical conditions of the product to be processed, the threshold value of the product, and the verification rule. After verification, the verification tool outputs the design data and a polygon of the simulation result in verification.

Figure 20A:
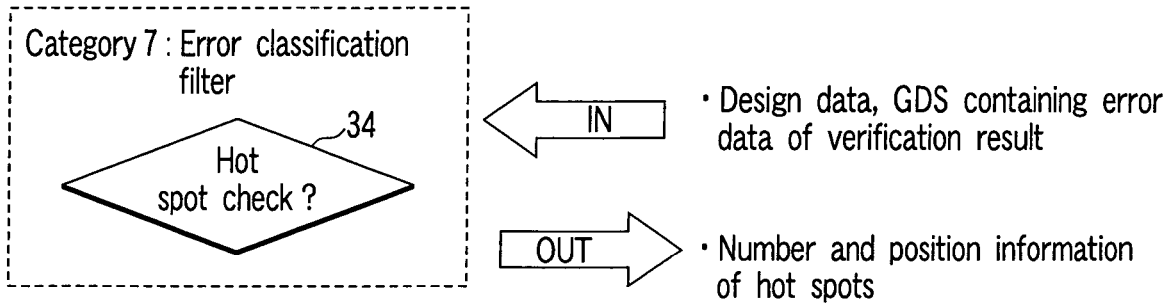
Figure 20B:
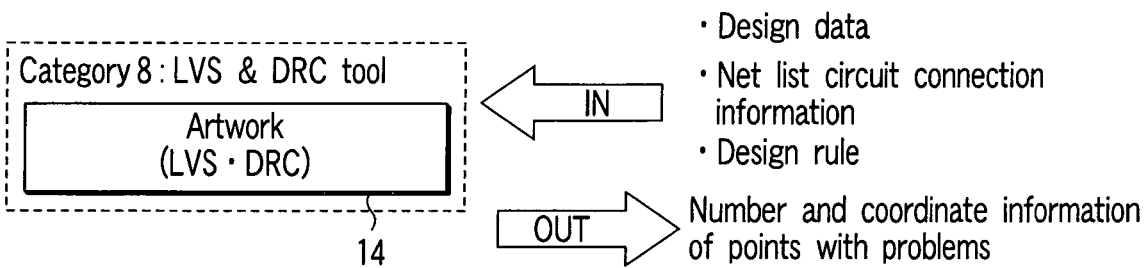
Figure 20C:
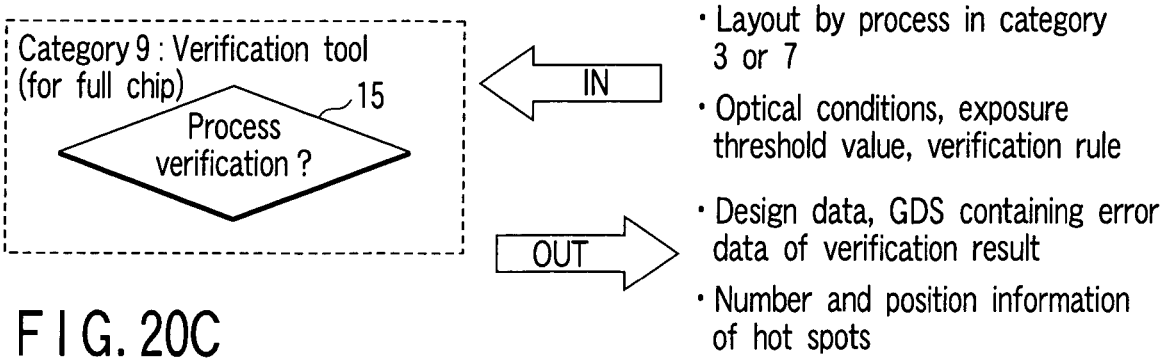

In category 7 (step 34), as shown in FIG. 20A, error results output from the verification tool are classified by an error classification filter, and hot spot information (number and coordinates of hot spots) is extracted, as in the third embodiment. On the basis of the hot spot information, correction is executed for each cell from the viewpoint of lithography. In category 8 (step 14), artwork is executed by using LVS and DRC tools, as shown in FIG. 20B. In category 9 (step 15), process verification for the full chip (full-chip verification) is executed by using a verification tool, as shown in FIG. 20C.

In full-chip verification of category 9, the layout obtained as a result of the replacement process executed in category 3 and correction executed in category 7 from the viewpoint of lithography on the basis of the hot spot information is finally verified for the full chip. Since errors which must be eliminated are corrected by the preceding process, the load on the full-chip verification is not so heavy.

With the above-described series of processes, efficient pattern design can be executed from the viewpoint of both timing and lithography. Main processes of this embodiment corresponding to the process steps will be described with an emphasis on steps different from the normal method.

The intra-cell layout and inter-cell routing of the design data handled in this process are designed on the basis of the typical design rule. For this reason, some cells have a sufficient timing margin, and others do not satisfy the specifications already. The determination process for cell replacement was executed in the process of category 3 on the basis of the timing analysis result in category 2 and the timing specifications. A cell determined by timing analysis to have a timing margin larger than the calculation value by 7% or more on the faster side was replaced with the cell designed by the design rule stricter (thinner) than the typical value. Conversely, a cell which already did not satisfy the timing specifications on the slower side of the typical value was replaced with the cell designed by the design rule more lenient (thicker) than the typical value.

With this process, the cells of critical path portions were replaced with the cell designed by the stricter design rule. The remaining portions designed by the excessively strict design rule were eliminated. A typical cell is designed on the basis of the rule of the transistor gate width and routing corresponding to the design rule of the product. For the cell designed by the typical design rule, a cell designed by a design rule 10% thicker than the typical design rule and a cell designed by a design rule 10% thinner than the typical design rule were prepared. A typical routing design rule, a routing scheme based on a design rule 10% thinner than the typical design rule, and a routing scheme based on a design rule 10% thicker than the typical design rule are present in correspondence with the respective cells described above.

Cells registered in the library in advance were used as the replacement cells. A replaced cell was output in a different GDS layer in category 5. That is, when all cells and routing are output as GDS data, the cells are written in three kinds of layers. In this way, specification comparison and cell replacement were ended up to the Nth cell.

In the above-described operation, cell routing portion specification comparison and routing correction were executed in parallel. More specifically, predetermined cell routing specifications registered in the library were compared with the timing margin of cell routing. If there was a sufficient margin on the faster side as compared to the specifications, and the cell was necessary for, e.g., a critical path, correction to the stricter (thinner) design rule was done. To the contrary, a portion where there was no sufficient margin as compared to the specifications or already shortage of timing margin occurred already, the rule was corrected to the more lenient (thicker) design rule. After the cells and routing were corrected, the layout of cells and routing written in three kinds of layers was output.

After that, hot spots were checked for each of the cells and routing portions in different layers. First, hot spot check was done for cells designed using the typical design rule without replacement. As a result, it was found that hot spots were present in the cell routing portions. The image of the hot spot information was saved. A routing condition (design rule) to avoid the layout of the hot spots was input to the ECO process engine for routing correction. The routing correction condition not to generate an error is shown in, e.g., the graph in FIG. 3 or the rule table in FIG. 4.

Then, routing correction based on the routing rule was executed by the ECO process. Artwork in category 8 was executed, and process verification in category 9 was executed. As a result, process verification non-compliance points were still detected in the routing portions. The routing layout was finely corrected by the ECO process to nullify the process verification non-compliance points, and the flow advanced to the testing step. On the other hand, the steps in categories 5 to 9 were executed for cells and routing portions which were written in another layer and included no critical paths.

The number of hot spots of routing portions was 0 in the cells designed by the design rule more lenient than the typical design rule. The number of non-compliance points was also 0 in the process verification result after artwork in category 8. The number of hot spots largely increased in the cells designed by the design rule stricter than the typical design rule. However, all the hot spots could be eliminated by automatic correction by inputting the rule to avoid the hot spots to the ECO process engine for routing correction. After artwork in category 8 was executed, process verification was executed. Non-compliance points were still detected. However, the errors could be eliminated by finely correcting the routing portions.

In this embodiment, three kinds of replacement cells were prepared for a typical cell. However, the number of kinds of replacement cells is not limited to three. Cells designed by design rules changed by +10% were prepared. However, the percentage can also be set variously in accordance with the type or generation of a device.

In this embodiment, the layout of a critical path portion important from the viewpoint of timing was selectively corrected. If the critical path portion cannot be changed, cell replacement and routing correction can selectively be done for a layout of a portion except the critical path portion. In any case, the critical path portions and other portions are in different layers. Hence, a layer for cell replacement and routing correction can be selected and processed in accordance with the purpose.

Sixth Embodiment

FIG. 22 is a flowchart showing a pattern data design method according to the sixth embodiment of the present invention.

The design flow of the sixth embodiment is almost the same as that of the fifth embodiment shown in FIG. 18 except that an OPC/process verification step 25 is executed in place of the process verification step 15. In the step 25, OPC is executed before process verification. The process flow of this embodiment will be described below.

FIGS. 23A to 23E and 24A to 24C show categories of the flow in FIG. 22 divided in accordance with the tools of processes.

In the process of this embodiment, as category 1 (steps 11 and 12), a cell placement/routing process is executed by using a P & R tool, as shown in FIG. 23A, as in the fifth embodiment. In category 2 (step 13), timing verification is executed for each cell designed on the basis of a typical design rule (DR) by using a timing analyzer for layout optimization. Input to the timing analyzer contains net list connection information representing the propagation time along the distance between the start point and the end point of a flip-flop, routing information including a line width, line length, and information of adjacent wiring lines, and timing restriction. On the basis of the input information, the timing analyzer calculates the delay in each path and compares the calculation result with the timing restriction, thereby outputting a timing margin of each path. In addition, the route of the critical path is specified from the delay calculation result.

In category 3 (step 51), as shown in FIG. 23C, the magnitude of the timing margin is checked by using a specification determination process tool on the basis of the timing analysis result in category 2, the layout after placement/routing, and the timing specifications. A cell in which the timing margins of all paths almost match the standard value (set in advance) is directly subjected to the process of the next category without executing any special process. On the other hand, for a cell which is determined by timing analysis to have no sufficient margin or already include a path that does not satisfy the margin specifications, cell replacement is executed by referring to a cell library.

The contents of the cell library used in this embodiment are the same as in FIG. 21. In the cell library, a cell designed by using a design rule thicker (more lenient) than the typical design rule and a cell designed by using a design rule thinner (stricter) than the typical design rule are prepared as replacement cells. In addition, a delay, power consumption data, delay center value, and standard deviation of each cell are registered in advance. A line width, space, delay center value, and standard deviation of each wiring line are also registered. The method of the replacement process is the same as in the fifth embodiment.

For an area which has undergone the layout correction process in category 4 (step 53), GDS data is output in a different layer. That is, after the process of category 4, the original design layout is converted into design data containing a plurality of layers.

In category 6 (step 33), as shown in FIG. 23E, the design data containing a plurality of layers output in category 4 is subjected to OPC using an OPC tool. Then, process verification is executed for each layer by using a verification tool. Input to the OPC/verification tool contains the design data output in category 4, optical conditions of the product to be processed, the threshold value of the product, OPC rule, and the verification rule. After the process of category 6, the design data, data that has undergone OPC, and a polygon of the simulation result in verification are output.

Figure 24A:
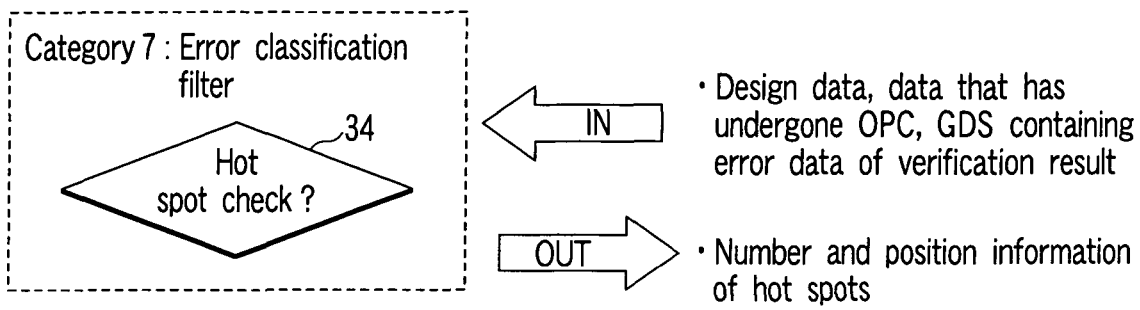
Figure 24B:
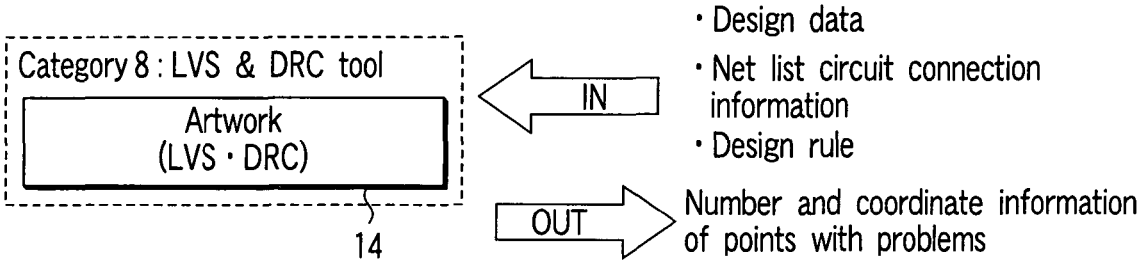
Figure 24C:
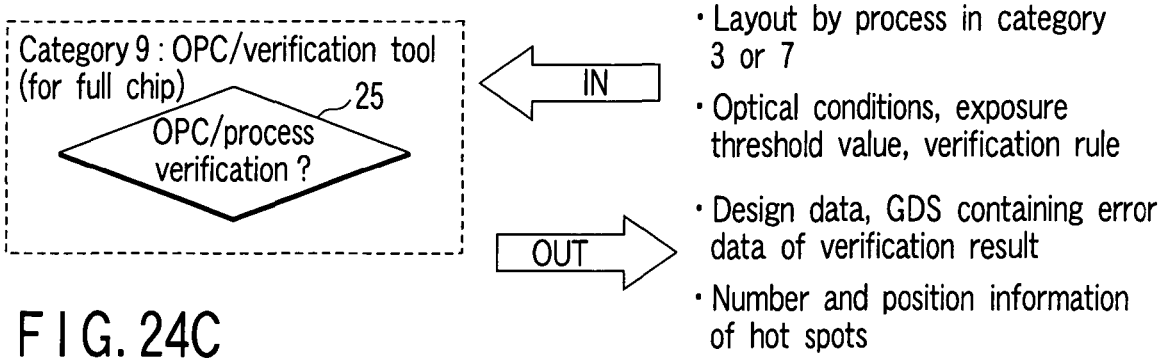
Figure 27:
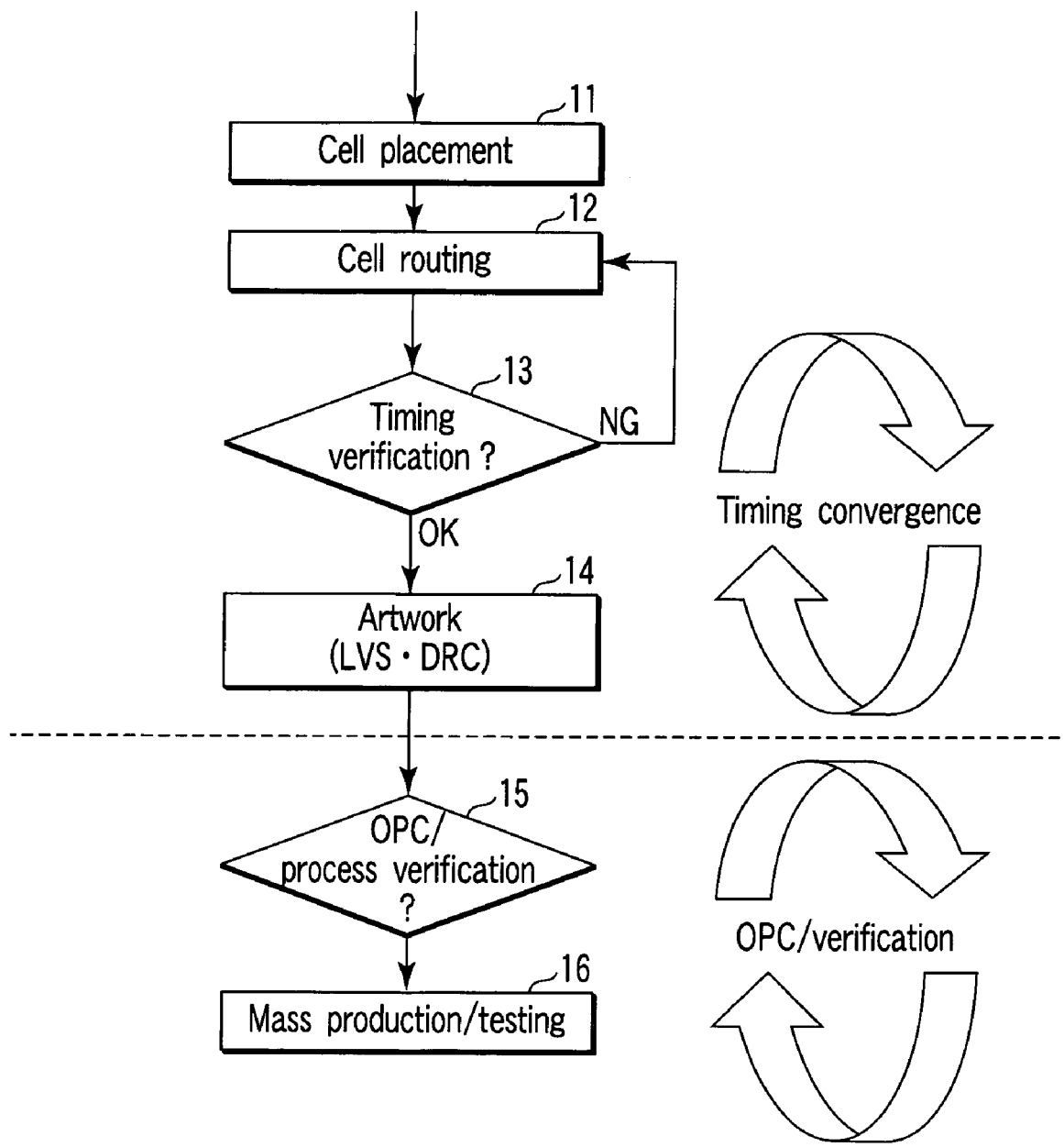
FIG. 27 is a flowchart showing a conventional pattern design method.

In category 7 (step 34), as shown in FIG. 24A, simulation results output from the verification tool are classified by an error classification filter, and hot spot information (number and coordinates of hot spots) is extracted. On the basis of the hot spot information, correction is executed for each cell from the viewpoint of lithography. In category 8 (step 14), artwork is executed by using LVS and DRC tools, as shown in FIG. 24B. In category 9 (step 25), OPC is executed for the full chip, and then, process verification (full-chip verification) is executed, as shown in FIG. 24C.

In full-chip verification of category 9, the layout obtained as a result of the layout correction process executed in category 4 and correction executed in category 7 from the viewpoint of lithography on the basis of the hot spot information is subjected to OPC and finally verified for the full chip. Since errors which must be eliminated are corrected by the preceding process, the number of iteration of OPC is small, and the load on the full-chip verification is not so heavy. With the above-described series of processes, efficient pattern design can be executed from the viewpoint of both timing and lithography.

Processes according to the method of this embodiment will be described below. The intra-cell layout and cell routing of the design data handled in this process are designed on the basis of the typical design rule. For this reason, some cells have a sufficient timing margin, and others do not satisfy the specifications already. The determination process for cell replacement was executed in the process of category 3 on the basis of the timing analysis result in category 2 and the timing specifications. A typical cell is designed on the basis of the rule of the transistor gate width and routing corresponding to the design rule of the product. As in the fifth embodiment, for the cell designed by the typical design rule, a cell designed by a design rule 10% thicker than the typical design rule and a cell designed by a design rule 10% thinner than the typical design rule were prepared. A typical routing design rule, a routing scheme based on a design rule 10% thinner than the typical design rule, and a routing scheme based on a design rule 10% thicker than the typical design rule are present in correspondence with the respective cells described above. Cells registered in the library in advance were used as the replacement cells. A replaced cell was output in a different GDS layer.

After cell placement, cell routing, and timing analysis were executed in accordance with the flow shown in FIG. 22, the timing specifications of each cell described in the library were compared with predetermined timing specifications. In this stage, all cells are designed by using the typical design rule. The timing margin of the first cell was neither more nor less than the timing specifications and remained the cell designed by the typical design rule. The second cell included a critical path portion and had a timing margin larger than the timing specifications by 7% or more on the faster side. Hence, the cell was replaced with the cell designed by the stricter (thinner) design rule.

A cell replaced with a cell designed on the basis of a value except the typical value was output with a layer number different from the typical layer upon GDS output. That is, when all cells and routing are output as GDS data, the cells are written in three kinds of layers. In this way, specification comparison and cell replacement were ended up to the Nth cell.

In the above-described operation, cell routing portion specification comparison and routing correction were executed in parallel. More specifically, predetermined cell routing specifications registered in the library were compared with the timing margin of cell routing. If there was a sufficient margin on the faster side as compared to the specifications, and the cell was necessary for, e.g., a critical path, correction to the stricter (thinner) design rule was done. To the contrary, a portion where there was no sufficient margin as compared to the specifications or already shortage of timing margin occurred already, the rule was corrected to the more lenient (thicker) design rule. The layout which is corrected by using the corrected design rule, like the cell, is output in a different layer upon GDS output. After both the cells and routing were corrected, the layout of cells and routing written in three kinds of layers was output.

After that, OPC and hot spot check were executed for each of the cells and routing portions in different layers. First, OPC was executed for cells designed using the typical design rule without replacement. The typical conditions are based on the design rule of the product. Hence, the process was executed by collecting pieces of information necessary for OPC in consideration of the conditions of the design rule and the optical conditions. Then, verification was performed under the conditions of the product to check hot spots. As a result, it was found that hot spots were present in the cell routing portions.

However, the number of hot spots was smaller than in the fifth embodiment because the OPC process was executed in the sixth embodiment. The image of the hot spot information was saved. A routing condition (design rule) to avoid the layout of the hot spots was input to the ECO process engine for routing correction. The routing correction condition not to generate an error is shown in, e.g., the graph in FIG. 3 or the rule table in FIG. 4.

Then, routing correction based on the routing rule was executed by the ECO process. After artwork, process verification was executed. As a result, process verification non-compliance points were still detected in the routing portions. The routing layout was finely corrected by the ECO process to nullify the process verification non-compliance points, and the flow advanced to the testing step. On the other hand, the steps in categories 5 to 9 were executed for cells and routing portions which were written in another layer and included no critical paths.

Next, OPC was executed for cells designed using the design rule more lenient than the typical design rule. A design rule and experimental conditions more lenient than the typical design rule and conditions by 10% were prepared in the OPC process. Since the layout was based on the lenient design rule from the beginning, the number of iteration of OPC was small, and the OPC iteration load could be reduced. Then, verification was performed under the design rule and experimental conditions more lenient than the typical design rule and conditions to check hot spots. As a result, it was found that hot spots were present in the cell routing portions.

However, the number of hot spots was smaller than in the fifth embodiment because the OPC process was executed in the sixth embodiment. The image of the hot spot information was saved. A routing condition (design rule) to avoid the layout of the hot spots was input to the ECO process engine for routing correction. The routing correction condition not to generate an error is shown in, e.g., the graph in FIG. 3 or the rule table in FIG. 4.

Then, routing correction based on the routing rule was executed by the ECO process. After artwork was executed, process verification was executed. As a result, process verification non-compliance points were still detected in the routing portions. The routing layout was finely corrected by the ECO process to nullify the process verification non-compliance points, and the flow advanced to the testing step. On the other hand, the steps in categories 5 to 9 were executed for cells and routing portions which were written in another layer and included no critical paths.

Next, OPC was executed for cells designed using the design rule stricter than the typical design rule. The cells and routing designed by the stricter design rule were subjected to OPC on the basis of information of a design rule stricter than the design rule of the product by 10% and new experimental conditions shifted by 10%. In this case, OPC iteration took longer time than that for the layout of cells and routing designed on the basis of the typical design rule because the layout was based on the design rule stricter than the typical design rule. However, since the layout based on the stricter design rule was mainly included in the critical path portions, the layout scale was small, and the load was not so large.

When verification was performed by using the design rule stricter than the typical design rule by 10% and the new experimental conditions, a number of hot spots were detected in the routing portions. When a rule to avoid the hot spots was input to the ECO process engine for routing correction to execute automatic correction, all the hot spots could be eliminated. After artwork was executed, process verification was executed. Non-compliance points were still detected. When the routing layout was finely corrected by the ECO process, the errors could be eliminated.

In this embodiment, three kinds of replacement cells were prepared for a typical cell. However, the number of kinds of replacement cells is not limited to three. Cells designed by design rules changed by ±10% were prepared. However, the percentage can also be set variously in accordance with the type or generation of a device. As the conditions in OPC, the design rules and experimental conditions changed by ±10% from the typical design rule and conditions were prepared. However, the conditions are not limited to this embodiment, either and can be set variously.

In this embodiment, the layout of a critical path portion important from the viewpoint of timing was selectively corrected. If the critical path portion cannot be changed, cell replacement and routing correction can selectively be done for a layout of a portion except the critical path portion. In any case, the critical path portions and other portions are in different layers. Hence, a layer for cell replacement and routing correction can be selected and processed in accordance with the purpose.

Modifications

The present invention is not limited to the above-described embodiments. Modifications to the embodiments and preferable modes will be described below.

The first to sixth embodiments include the following modes.

Analysis of the electrical characteristic of a circuit in the first to sixth embodiments includes inputting circuit connection information, routing information, and timing restriction of a signal to propagate in the circuit to an electrical characteristic analyzing system for design pattern optimization, which is incorporated in the P & R system, and obtaining the timing margin of the signal to propagate in the circuit and a route to determine the propagation rate in the circuit. The routing information includes a line width, line length, and information of adjacent wiring lines.

Design pattern correction is done by inputting an alienation position and the magnitude of a difference amount to a layout correction unit incorporated in the P & R system. A pattern to be formed on a wafer surface by mask pattern data is predicted by process simulation.

The difference amount between the predictive pattern and the pattern to be formed on the wafer surface by the mask pattern data is the difference between the shape of the mask pattern data corresponding to the design pattern and the shape of the pattern to be formed on the wafer surface by the mask pattern data.

The difference amount between the predictive pattern and the pattern to be formed on the wafer surface by the mask pattern data is the difference between the position of the mask pattern data corresponding to the design pattern and the position of the pattern to be formed on the wafer surface by the mask pattern data.

An allowable variation amount is determined on the basis of the dimensional accuracy required of the generation of semiconductor devices to be formed by the design pattern. Design pattern information contains the position coordinates of the design pattern and a design restriction. After the design step, the step is repeated until the alienation falls within the allowable variation amount.

The third and fifth embodiments include the following modes.

The third and fifth embodiments include steps of executing a correlation test between design pattern data and circuit schematic data and a design rule violation test of the design pattern, predicting a pattern to be formed on a wafer surface by mask pattern data, checking a difference amount between the predictive pattern and the pattern to be formed on the wafer surface by the mask pattern data, comparing the difference amount with a predetermined allowable variation amount of the difference amount, locally correcting the shape and position of routing of the design pattern corresponding to the mask pattern if the difference amount is larger than the predetermined allowable variation amount of the difference amount in the comparison step.

The third and sixth embodiments include the following mode.

(1) Restrictions of the upper and lower limits of a wiring space are set in advance in accordance with the wiring layer, line width, and line length of a design pattern to make the difference amount between the predictive pattern and the pattern to be formed on the wafer surface by the mask pattern data fall within the allowable variation amount. The third and sixth embodiments include a step of correcting, for a portion that violates to the restrictions, the position and shape of local routing to satisfy the restrictions by changing at least one of the wiring layer, line width, line length, and wiring space.

(2) In a microarea where the degree of local routing congestion is high, and the difference amount between the predictive pattern and the pattern to be formed on the wafer surface by the mask pattern data is larger than the allowable variation amount, the cell placement position is improved to reduce the degree of congestion.

(3) After correction of the design pattern, the corrected design pattern is output with a different layer number added to the corrected portion.

The fourth and sixth embodiments include the following mode.

(1) The fourth and sixth embodiments include steps of executing a correlation test between design pattern data and circuit schematic data and a design rule violation test of the design pattern, correcting mask pattern data, predicting a pattern to be formed on a wafer surface by the corrected mask pattern, checking a difference amount between the predictive pattern and the pattern to be formed on the wafer surface by the corrected mask pattern data, comparing the difference amount with a predetermined allowable variation amount of the difference amount, locally correcting the shape and position of routing of the design pattern corresponding to the mask pattern if the difference amount is larger than the predetermined allowable variation amount of the difference amount in the comparison step.

The fifth embodiment includes the following mode. Restrictions of the upper and lower limits of a wiring space are given in forms of a graph and a table.

The fifth and sixth embodiments include the following modes.

(1) Design pattern correction is done by inputting path delay data, routing delay data, and design restriction of each cell to a layout correction system incorporated in the P & R system and outputting the corrected design pattern.

(2) The electrical characteristic of a cell includes data about a circuit delay, power consumption data, delay center value, and standard deviation.

(3) The electrical characteristic of a cell is recorded in a cell library. A replacement cell is registered in the cell library.

(4) The replacement cell registered in the cell library is created by applying a design rule with different dimensions of a transistor and routing to the standard design rule of a transistor and routing.

(5) The replacement cell registered in the cell library describes a design pattern to satisfy the result of electrical characteristic analysis and make the difference amount fall within a predetermined allowable variation amount.

(6) The electrical characteristic of a cell is prepared in a plurality of patterns centered on a predetermined standard value in association with the dimensions and line width of the transistor of the cell.

Seventh Embodiment

The above-described first to sixth embodiments of the present invention can also be executed by, e.g., a pattern design apparatus to be described below. FIG. 25 is a block diagram showing the arrangement of a pattern design apparatus according to the seventh embodiment of the present invention.

As shown in FIG. 25, the pattern design apparatus comprises, a CPU 62, main memory 63, auxiliary (external) memory 64, input unit 65, and output unit 66 which are connected to a data bus 61. The auxiliary memory 64 includes, e.g., an LSI (e.g., a ROM), memory card, or hard disk. A program showing the sequences of the pattern design methods shown in FIGS. 1, 7, 9, 14, 18, and 22 and a cell library registering various kinds of cells to be used for pattern design are recorded on the auxiliary memory 64. Pieces of design information necessary for pattern design are input to the input unit 65. The CPU 62 executes a data process to execute pattern design by using data output from the auxiliary memory 64 and input unit 65. The main memory 63 temporarily stores data output from the auxiliary memory 64 and input unit 65 or data output from the CPU. The output unit 66 outputs, to the outside, data processed by the CPU 62 or data output from the auxiliary memory 64 and input unit 65 as needed.

In the pattern design apparatus having the above-described arrangement, programs and cell data read out from the auxiliary memory 64 and design information input to the input unit 65 are stored in the main memory as needed and also processed by the CPU to execute pattern design. Information about pattern design is output to the outside through the output unit.

Eighth Embodiment

The above-described embodiments of the present invention can also be applied to a semiconductor device manufacturing method. FIG. 26 is a flowchart showing a semiconductor device manufacturing method according to the eighth embodiment of the present invention.

In the semiconductor device manufacturing method, after the process verification step 15 (or 25) of the first to sixth embodiments, a photomask manufacturing step 71 and semiconductor device manufacturing step 72 are executed sequentially. More specifically, after the process verification step 15 (or 25) in FIGS. 1, 7, 9, 14, 18, and 22, a photomask is manufactured on the basis of mask pattern data output from the process verification step, as shown in FIG. 26 (step 71). Next, cells and wiring lines of a semiconductor circuit are formed on a semiconductor substrate by using the photomask, thereby manufacturing a semiconductor device (step 72).

According to the first to eighth embodiments of the present invention, the load of timing closure on the design side can largely be reduced, and the load of OPC and process verification on the manufacturing side can be reduced by feeding back the process verification result to the design step. Hence, the design efficiency can be increased.

The first to eighth embodiments of the present invention can provide a pattern design method capable of solving the problem of tradeoff between OPC verification executed on the manufacturing side and timing optimization executed on the design side and increasing the design efficiency by reducing the load of timing closure on the design side and the load of OPC and process verification on the manufacturing side.

In addition to the pattern design method, the present invention can also be applied to a pattern design system (apparatus) using the method, a computer program product, a photomask, a manufacturing method thereof, a semiconductor device, and a manufacturing method thereof. Various changes and modifications can also be made within the spirit and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A computer-implemented pattern design method of designing a pattern of a semiconductor circuit to be formed on a substrate, comprising:
   creating, by the computer, a design pattern by placing a plurality of cells in each functional block as a unit of the semiconductor circuit and executing routing among the plurality of placed cells;
   analyzing, by the computer, an electrical characteristic of the semiconductor circuit corresponding to the design pattern;
   determining, by the computer, whether an analysis result of the electrical characteristic satisfies a predetermined allowance of the electrical characteristic;
   when the analysis result of the electrical characteristic satisfies the allowance, creating, by the computer, mask pattern data based on the design pattern;
   when the analysis result of the electrical characteristic does not satisfy the allowance, creating the design pattern again;
   predicting, by the computer, a predictive pattern to be formed on the substrate by the mask pattern data;
   checking, by the computer, a difference amount between the predictive pattern and a target pattern to be formed on the substrate;
   comparing, by the computer, the difference amount with a predetermined allowable variation amount; and
   correcting, by the computer, at least one of the placement of the cells and the routing among the cells in the design pattern corresponding to the mask pattern data used to predict the predictive pattern if the difference amount is larger than the allowable variation amount in the comparing.

2. The method according to claim 1, wherein creating the mask pattern data comprises executing a correlation test between the mask pattern data and a circuit diagram of the semiconductor circuit and a design rule violation test of the mask pattern data.

3. The method according to claim 1, further comprising executing optical proximity correction for the mask pattern data after creating the mask pattern data.

4. The method according to claim 1, wherein analysis of the electrical characteristic of the semiconductor circuit comprises inputting circuit connection information, routing information, and timing restriction of a signal to propagate in the circuit to an electrical characteristic analyzing system to optimize the design pattern, which is incorporated in a place & router system to execute placement and routing, and obtaining a timing margin of the signal to propagate in the circuit and a route to determine a propagation rate in the circuit.

5. The method according to claim 1, wherein a process from creating the design pattern to correcting at least one of the placement and routing of the cells is repeated until the difference amount is not more than the allowable variation amount.

6. A computer program product for causing a computer to perform a method for designing a pattern of a semiconductor circuit to be formed on a substrate, the method comprising:

creating a design pattern by placing a plurality of cells and executing routing among the plurality of placed cells;

analyzing an electrical characteristic of the semiconductor circuit corresponding to the design pattern;

determining whether an analysis result of the electrical characteristic satisfies a predetermined allowance of the electrical characteristic;

when the analysis result of the electrical characteristic satisfies the allowance, creating mask pattern data based on the design pattern;

when the analysis result of the electrical characteristic does not satisfy the allowance, creating the design pattern again;

predicting a predictive pattern to be formed on the substrate by the mask pattern data and correcting the placement of the cells and the routing among the cells if a difference amount between the design pattern and the predictive pattern is larger than an allowable variation amount.

* * * * *

UNITED STATES PATENT AND TRADEMARK OFFICE
CERTIFICATE OF CORRECTION

PATENT NO. : 7,784,020 B2  Page 1 of 1
APPLICATION NO. : 11/429077
DATED : August 24, 2010
INVENTOR(S) : Izuha et al.

It is certified that error appears in the above-identified patent and that said Letters Patent is hereby corrected as shown below:

Claim 6, column 26, line 11, change "data and" to --data; and--.

Signed and Sealed this

Seventh Day of December, 2010

David J. Kappos
*Director of the United States Patent and Trademark Office*